United States Patent
Shibata et al.

(10) Patent No.: US 11,032,913 B2
(45) Date of Patent: Jun. 8, 2021

(54) WIRED CIRCUIT BOARD AND PRODUCTION METHOD THEREOF

(71) Applicant: NITTO DENKO CORPORATION, Osaka (JP)

(72) Inventors: Shusaku Shibata, Osaka (JP); Takahiro Takano, Osaka (JP); Hayato Takakura, Osaka (JP); Yoshihiro Kawamura, Osaka (JP); Shuichi Wakaki, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 16/464,422

(22) PCT Filed: Nov. 6, 2017

(86) PCT No.: PCT/JP2017/039980
§ 371 (c)(1),
(2) Date: May 28, 2019

(87) PCT Pub. No.: WO2018/100974
PCT Pub. Date: Jun. 7, 2018

(65) Prior Publication Data
US 2020/0344888 A1 Oct. 29, 2020

(30) Foreign Application Priority Data

Nov. 30, 2016 (JP) .............................. JP2016-232481

(51) Int. Cl.
*H05K 1/02* (2006.01)
*H05K 3/10* (2006.01)
(Continued)

(52) U.S. Cl.
CPC ............ *H05K 3/108* (2013.01); *H05K 1/0245* (2013.01); *H05K 1/0296* (2013.01); *H05K 1/189* (2013.01);
(Continued)

(58) Field of Classification Search
CPC ....................... H05K 1/0296; H05K 1/11–119
See application file for complete search history.

(56) References Cited

U.S. PATENT DOCUMENTS

| 5,286,584 A | 2/1994 | Gemmink et al. |
| 5,364,718 A | 11/1994 | Oae et al. |

(Continued)

FOREIGN PATENT DOCUMENTS

| CN | 1856214 A | 11/2006 |
| CN | 101499453 A | 8/2009 |

(Continued)

OTHER PUBLICATIONS

International Preliminary Report on Patentability issued by WIPO dated Jun. 4, 2019, in connection with International Patent Application No. PCT/JP2017/039980.
(Continued)

*Primary Examiner* — Timothy J Thompson
*Assistant Examiner* — Jeremy C Norris
(74) *Attorney, Agent, or Firm* — Edwards Neils LLC; Jean C. Edwards, Esq.

(57) ABSTRACT

An elongated wired circuit board including a plurality of wires arranged in parallel, wherein the plurality of wires each includes a first linear portion extending in a first linear direction, a second linear portion extending in a second linear direction, and a connection portion, the connection portion includes a first side, a second side, a third side, and a fourth side, length y1 and length S satisfy $0<y1<S$, length y1 extending from the first corner portion reaching the first
(Continued)

widthwise other end edge of the first linear portion, and length S extending from the first widthwise other end edge of the first linear portion of one wire, and the predetermined angle θ satisfies 0<θ<1 deg.

4 Claims, 18 Drawing Sheets

(51) Int. Cl.
  *H05K 1/18* (2006.01)
  *H05K 3/18* (2006.01)
(52) U.S. Cl.
  CPC ..... *H05K 3/18* (2013.01); *H05K 2201/09236* (2013.01); *H05K 2201/09272* (2013.01); *H05K 2201/09727* (2013.01); *H05K 2201/10151* (2013.01); *H05K 2203/0505* (2013.01); *H05K 2203/1476* (2013.01)

(56) References Cited

U.S. PATENT DOCUMENTS

| | | | |
|---|---|---|---|
| 5,652,645 | A | 7/1997 | Jain |
| 5,792,591 | A | 8/1998 | Theuwissen |
| 6,160,611 | A | 12/2000 | Miyake |
| 7,351,914 | B2 | 4/2008 | Kaneto et al. |
| 7,632,236 | B2 | 12/2009 | Kaneto et al. |
| 2006/0246268 | A1 | 11/2006 | Honjo et al. |
| 2008/0032209 | A1 | 2/2008 | Imken |
| 2009/0195998 | A1 | 8/2009 | Ishimaru et al. |
| 2013/0224637 | A1 | 8/2013 | Hirayama et al. |
| 2014/0231124 | A1 | 8/2014 | Tatsuta |
| 2015/0357293 | A1 | 12/2015 | Tomita |

FOREIGN PATENT DOCUMENTS

| | | | |
|---|---|---|---|
| JP | 63-018352 | A | 1/1988 |
| JP | 2-71509 | A | 3/1990 |
| JP | 4-9846 | A | 1/1992 |
| JP | 7-272996 | A | 10/1995 |
| JP | 11-067639 | A | 3/1999 |
| JP | 11-237744 | A | 8/1999 |
| JP | 2000-193546 | A | 7/2000 |
| JP | 2005-286207 | A | 10/2005 |
| JP | 2009-545774 | A | 12/2009 |
| JP | 4426430 | B2 | 3/2010 |
| JP | 4648063 | B2 | 3/2011 |
| JP | 2011-205042 | A | 10/2011 |
| JP | 2013-174728 | A | 9/2013 |
| JP | 2016-082145 | A | 5/2016 |
| TW | 201325331 | A1 | 6/2013 |
| WO | 2014/109044 | A1 | 7/2014 |

OTHER PUBLICATIONS

International Search Report Issued in PCT/JP2017/039980 dated Feb. 6, 2018.
Opinion Issued in PCT/JP2017/039980 dated Feb. 6, 2018.
Office Action, issued by the Taiwanese Patent Office dated Dec. 15, 2020, in connection with Taiwanese Patent Application No. 106139434.

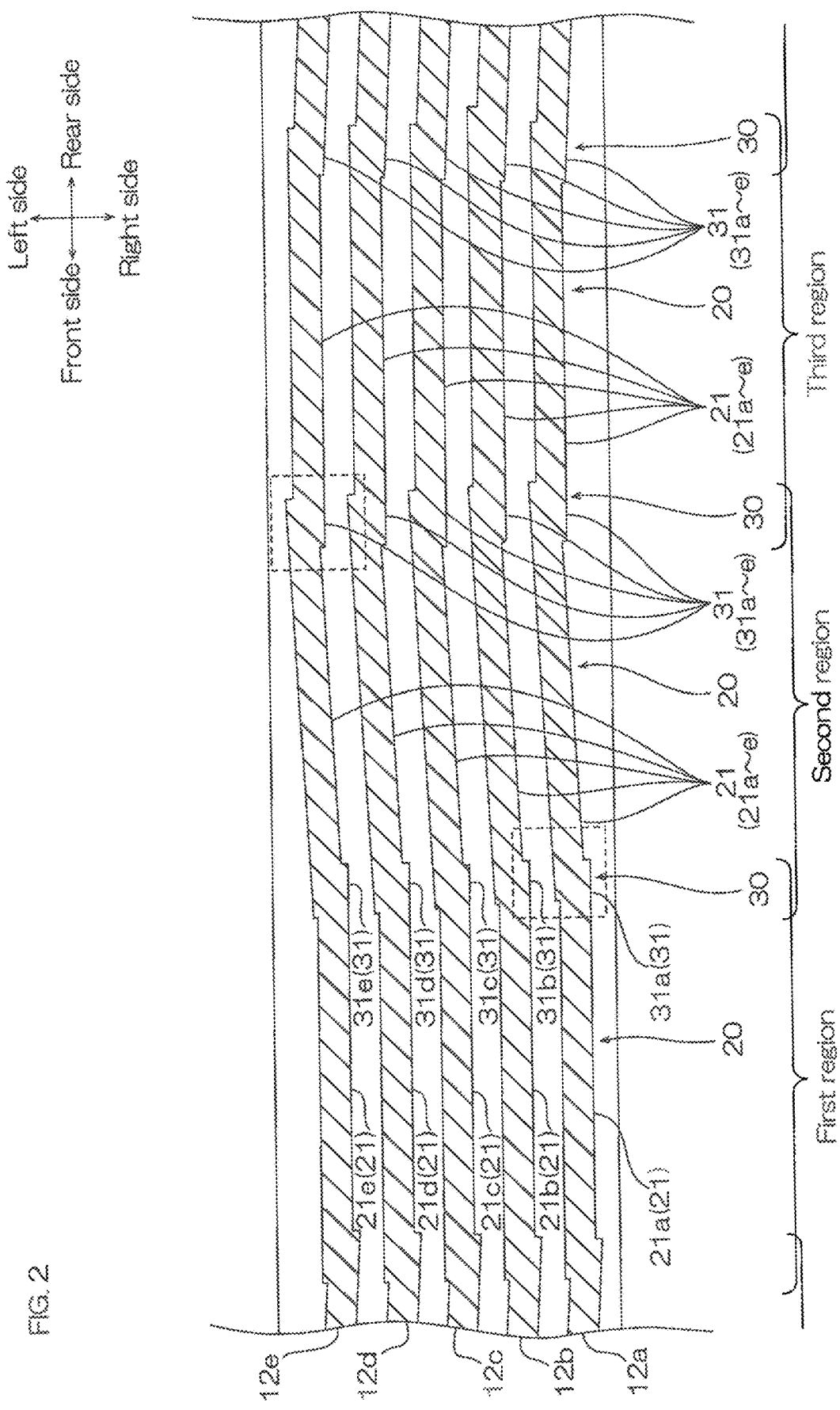

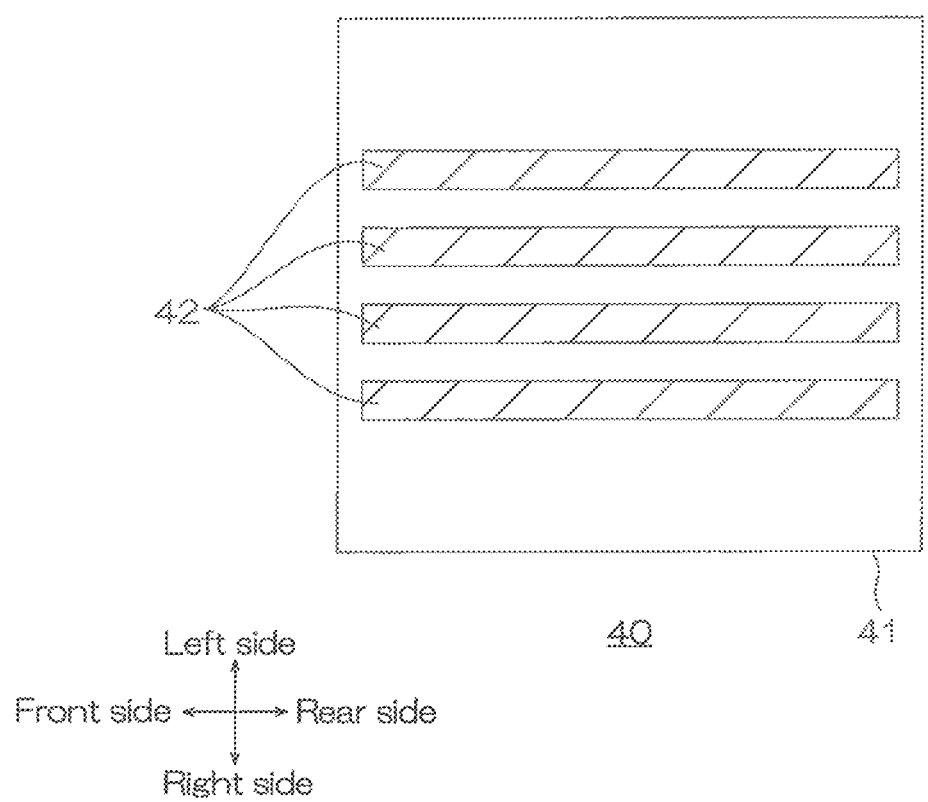

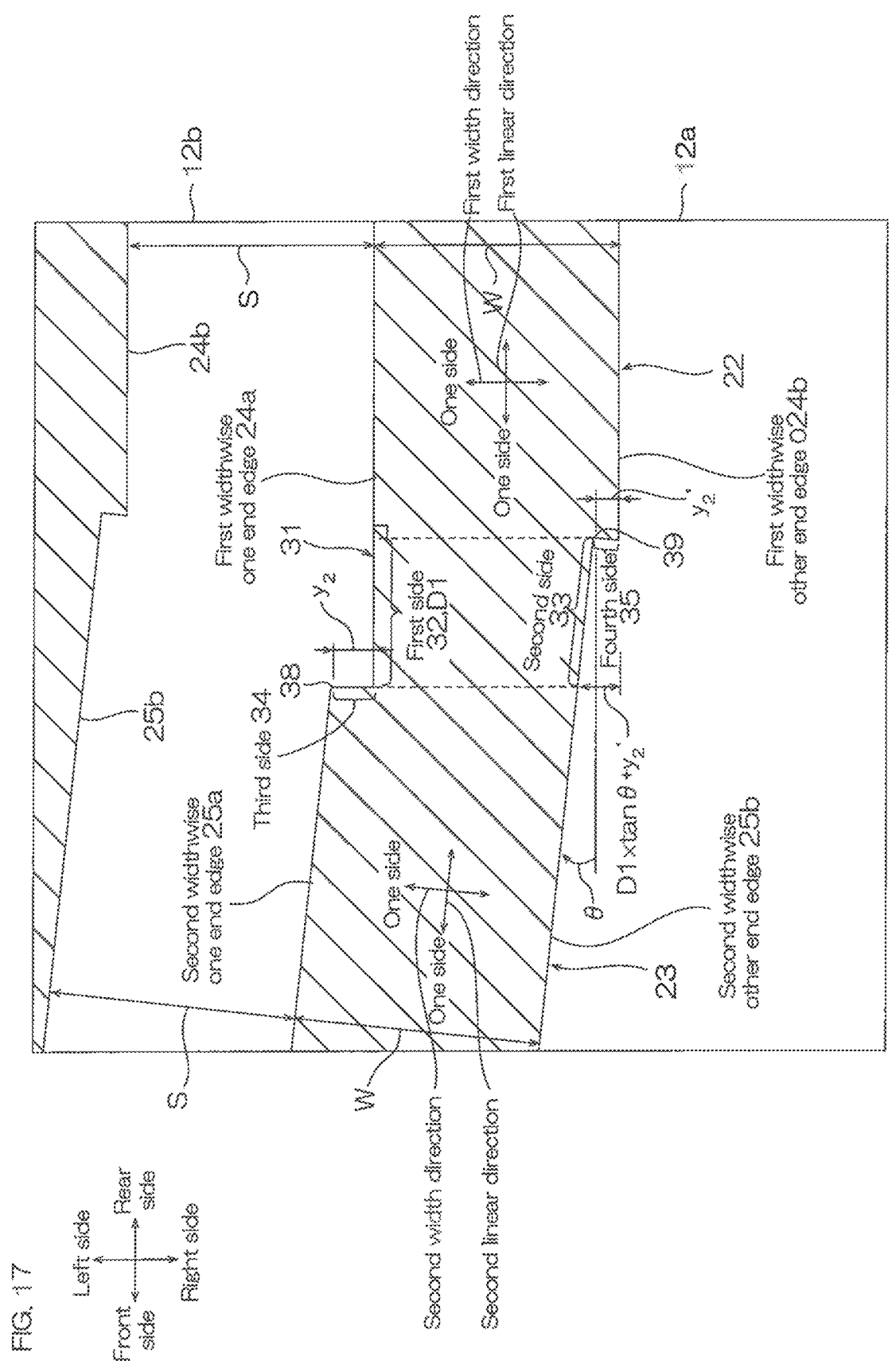

WIRED CIRCUIT BOARD AND PRODUCTION METHOD THEREOF

CROSS-REFERENCE TO RELATED APPLICATIONS

The present application is a 35 U.S.C. 371 National Stage Entry of PCT/JP2017/039980, filed on Nov. 6, 2017, which claims priority from Japanese Patent Application No. 2016-232481, filed on Nov. 30, 2016, the contents of all of which are herein incorporated by reference in their entirety.

TECHNICAL FIELD

The present invention relates to a wired circuit board and a production method thereof. In particular, the present invention relates to an elongated flexible wired circuit board and a production method thereof.

BACKGROUND ART

Conventionally, examination or treatment has been conducted using a catheter on which an electronic component such as a pressure sensor, temperature sensor, and heating element are mounted, and inserting the catheter into the patient's body. Such a catheter contains an elongated flexible wired circuit board inside the catheter tube, the elongated flexible wired circuit board extending from the front end reaching the rear end of the catheter tube. The conductive pattern formed on the elongated flexible wired circuit board includes, at its front end, a terminal for mounting the electronic components, and at its rear end, a terminal for connecting with external components (monitor or power source, etc.), and an elongated wire for connecting these terminals.

Meanwhile, the conductive pattern is formed by various methods such as subtractive method and semiadditive method. In these methods, a resist is formed on the entire surface of the metal film, a photomask matching the wire is disposed, the resist is exposed to light and developed, and thereafter, wires are formed.

However, the length of the wires of the elongated flexible wired circuit board used for catheters is at least 600 mm or more, and sometimes more than 2000 mm. On the other hand, the photomask has a general size of about 250 mm×250 mm. Therefore, one set of exposure and development cannot form the target wires. Thus, patent document 1 proposes a method in which exposure and development are conducted a plurality of times (ref: patent document 1).

Patent document 1 discloses a production method of a flexible wired circuit board with a subtractive method. To be specific, the production method of patent document 1 includes, a step of forming a metal layer on an insulating layer substrate, a step of forming a resist layer on the metal layer, a step in which a photomask having an opening with a predetermined length and equal width at both end portions is disposed in a longitudinal direction of the insulating substrate so that the end portions of the opening overlap one after another and the resist layer is exposed to light repeatedly, a step of developing the resist pattern, and a step of forming wires by removing the metal layer where the resist pattern is not formed by etching.

CITATION LIST

Patent Document

Patent Document 1: Japanese Unexamined Patent Publication No. 2005-286207

SUMMARY OF THE INVENTION

Problem to be Solved by the Invention

Meanwhile, to decrease burden on patients, decrease in the diameter size of the catheter, and extra fine wires have been demanded.

However, when extra fine, elongated plural wires are tried to be formed using the production method of patent document 1, there are disadvantages in that at the position where the photomask is overlaid, the end portions of the opening tend to displace in a direction orthogonal to longitudinal direction or oblique direction. Therefore, at the overlaid position, one wire may be dislocated relative to the other wire in the width direction or oblique direction, and as a result, it may cause disconnection or short circuit with adjacent wires. That is, connection reliability is poor.

Furthermore, when dislocation of one wire to the other wire in the width direction is to be completely eliminated, the photomask has to be disposed with high accuracy. Therefore, productivity is poor.

The present invention provides an elongated wired circuit board with excellent connection reliability and productivity, and a production method thereof.

Means for Solving the Problem

The present invention [1] includes an elongated wired circuit board including a plurality of wires arranged in parallel, wherein the plurality of wires each includes a first linear portion extending in a first linear direction, a second linear portion having the same width as that of the first linear portion, disposed at one side in the first linear direction of the first linear portion, and extending in a second linear direction so as to have a predetermined angle θ relative to the first linear portion, and a connection portion disposed between the first linear portion and the second linear portion, being continuous with the first linear portion and the second linear portion, and having a width broader than the first linear portion;

the connection portion includes a first side further extending from a first widthwise one end edge orthogonal to the first linear direction of the first linear portion along the first linear direction, a second side further extending from the second widthwise other and edge orthogonal to the second linear direction of the second linear portion along the second linear direction, a third side connecting the first side with the second linear direction end edge of the second widthwise one end edge of the second linear portion and extending along the first-crossing direction crossing the first linear direction and the second linear direction, and a fourth side connecting the second side with the first linear direction end edge of the first widthwise other end edge of the first linear portion, and extending along a second-crossing direction crossing the first linear direction and the second linear direction;

length $y_1$ and length S satisfy the relationship of $0<y_1<S$, length $y_1$ extending from a first corner portion formed with the second side and the fourth side along the first width direction and reaching the first widthwise other end edge of the first linear portion and length S extending from the first widthwise other end edge of the first linear portion of one wire to a first widthwise one end edge of the first linear portion of the other wire along the first width direction in two wires adjacent to each other, and the predetermined angle θ satisfies the relationship of $0<θ<1$ deg.

With such a wired circuit board, the length $y_1$ from the first corner portion to the first linear portion and length S from the first linear portion of one wire to the first linear portion of the other wire (wire interval) satisfy $0<y_1<S$. That is, at the connection portion between the first linear portion and the second linear portion, widthwise dislocation between the first linear portion and the second linear portion is shorter than the wire interval S. Also, the predetermined angle θ satisfies $θ<1$ deg. That is, the angle formed with the first linear portion and the second linear portion is small. Thus, linearity can be secured even when the wire is elongated, short circuit between adjacent wires can be suppressed, and connection reliability is excellent.

Furthermore, the predetermined angle θ satisfies $θ<0$. That is, the angle formed with the linear direction of the first linear portion and the linear direction of the second linear portion is small. Therefore, strict adjustment for the angle formed with the first linear portion and the second linear portion is unnecessary, and thus productivity is excellent.

The present invention [2] includes the wired circuit board described in [1], wherein the length $D_1$ of the first side and the length S satisfy the relationship of $D_1 \times \tan θ + y_1 < S$.

With such a wired circuit board, at the connection portion between the first linear portion and the second linear portion, short circuit can be suppressed more reliably.

The present invention [3] includes the wired circuit board of [1] or [2], wherein the length $D_1$ and a length W of the first width direction of the first linear portion satisfy the relationship of $W \leq D_1$.

With such a wired circuit board, at the connection portion, the longitudinal length of the connection portion is sufficiently long. Therefore, the electric signal easily flows in the elongated direction while widthwise flow is suppressed at the connection portion. Thus, propagation of electric signals is excellent.

The present invention [4] includes an elongated wired circuit board including a plurality of wires arranged in parallel, wherein the plurality of wires each includes a first linear portion extending in a first linear direction, a second linear portion having the same width as that of the first linear portion, disposed at one side in the first linear direction of the first linear portion, and extending in a second linear direction so as to have a predetermined angle θ relative to the first linear portion, and a connection portion disposed between the first linear portion and the second linear portion, being continuous with the first linear portion and the second linear portion, and having a width narrower than that of the first linear portion;

the connection portion includes a first side further extending from a first widthwise one end edge orthogonal to the first linear direction of the first linear portion along the first linear direction, a second side further extending from the second widthwise other end edge orthogonal to the second linear direction of the second linear portion along the second linear direction, and the second linear portion includes a third side connecting the first side with the second widthwise one end edge of the second linear portion, and extending along the first-crossing direction crossing the first linear direction and the second linear direction, and the first linear portion includes a fourth side connecting the second side with the first widthwise other end edge of the first linear portion, and extending along the second-crossing direction crossing the first linear direction and the second linear direction, length $y_2$ and length W satisfy the relationship of $0<y_2<W$, the length $y_2$ extending from a second corner portion formed with the first widthwise one end edge of the second linear portion and the third side and reaching the first side along the first width direction, and the length W being the first width of the first linear portion, and the predetermined angle θ satisfy the relationship of $0<θ<1$ deg.

With such a wired circuit board, length $y_2$ from the second corner portion to the first side, and the length W of the first width of the first linear portion satisfy the relationship of $0<y_2<W$. That is, at the connection portion between the first linear portion and the second linear portion, widthwise dislocation between the first linear portion and the second linear portion is shorter than the width W of the first linear portion. Also, the predetermined angle θ satisfies $θ<1$ deg. Therefore, the angle formed with the first linear portion and the second linear portion is small. As a result, linearity can be secured even when the wire is elongated, while disconnection of the connection portion can be suppressed in the wires continuous in front-rear direction, and connection reliability is excellent.

Also, the predetermined angle θ satisfies $0<θ$. That is, the angle formed with the linear direction of the first linear portion and the linear direction of the second linear portion is small. Thus, strict adjustment for the angle formed with the first linear portion and the second linear portion is unnecessary, and therefore productivity is excellent.

The present invention [5] includes the wired circuit board of [4], wherein the first side length $D_1$ and the first width W satisfy the relationship of $D_1 \times \tan θ + y_2' < W$ (where $y_2'$ represents a length from the third corner portion formed with the second side and the fourth side to the first widthwise other end edge of the first linear portion along the first width direction).

With such a wired circuit board, at the connection portion between the first linear portion and the second linear portion, disconnection can be suppressed even more reliably.

The present invention [6] includes the wired circuit board of any one of [1] to [5], wherein the wire has a wire length of 600 mm or more.

Such a wired circuit board can be suitably used as a wired circuit board for catheters.

The present invention [7] includes the wired circuit board of any one of the [1] to [6], including a first insulating layer, a conductive pattern provided at one surface in the thickness direction of the first insulating layer, and a second insulating layer provided at one surface in the thickness direction of the conductive pattern, wherein the conductive pattern includes the wire.

With such a wired circuit board, the first insulating layer, wire, and second insulating layer are disposed in this order so as to contact with each other, and therefore no adhesive layer is necessary. Therefore, moisture and heat resistance is excellent, and the thickness can be decreased.

The present invention [8] includes a method for producing an elongated wired circuit board including a plurality of wires arranged in parallel, the method including the steps of: a first step, in which an insulating layer is prepared, and a second step, in which the plurality of wires arranged in parallel are formed on the surface of the insulating layer, wherein the second step includes a step (1), in which a metal thin film is formed on the surface of the insulating layer, a step (2), in which a photo resist is formed on the surface of the metal thin film, a step (3), in which a photomask is disposed on the surface of the photo resist so as to face the photo resist, the photomask having a light transmission portion formed as a plurality of linear patterns arranged in parallel so as to match the plurality of the wires, and the photo resist is exposed to light through the photomask, and a step (4), in which the photo resist facing the light transmission portion is removed to expose the metal thin film by development, a step (5), in which the plurality of wires are formed on the surface of the exposed metal thin film by plating, and a step (6), in which the remaining photo resist, and the metal thin film facing the remaining photo resist are removed, wherein the second step includes a step of conducting the step (3) a plurality of times so that a connection portion having a width broader than the linear pattern is formed in each wire by shifting the photomask relative to the photo resist in the first linear direction, and in the each step of the plurality of steps, the photomask is disposed so that the linear pattern of the light transmission portion of the following photomask has a predetermined angle θ (0<θ<1 deg) relative to the linear pattern of the light transmission portion of the previous photomask.

With such a method for producing a wired circuit board, a wired circuit board with connection reliability with suppressed short circuit can be produced with excellent productivity.

The present invention [9] includes a method for producing an elongated wired circuit board including a plurality of wires arranged in parallel, the method including the steps of: a first step, in which an insulating layer is prepared, and a second step, in which the plurality of wires arranged in parallel are formed on the surface of the insulating layer, wherein the second step includes a step (1), in which a metal thin film is formed on the surface of the insulating layer a step (2), in which a photo resist is formed on the surface of the metal thin film; a step (3), in which a photomask is disposed on the surface of the photo resist so as to face the photo resist, and the photo resist is exposed to light through the photomask, the photomask having a shield portion formed as a plurality of linear patterns arranged in parallel so as to match the plurality of the wires; a step (4), in which the photo resist facing the shield portion is removed to expose the metal thin film by development; a step (5), in which the plurality of wires are formed on the surface of the exposed metal thin film by plating; and a step (6), in which the remaining photo resist and the metal thin film facing the remaining photo resist are removed; wherein the second step includes a step of conducting the step (3) a plurality of times so that a connection portion having a width narrower than a linear pattern is formed in each wire by shifting the photomask relative to the photo resist in the first linear direction, and in the each step of the plurality of steps, the photomask is disposed so that the linear pattern of the shield portion of the following photomask has a predetermined angle θ (0<θ<1 deg) relative to the linear pattern of the shield portion of the previous photomask.

With such a method for producing a wired circuit board, a wired circuit board with connection reliability with suppressed disconnection can be produced with excellent productivity.

Effects of the Invention

The wired circuit board produced by the production method of the present invention has excellent connection reliability and productivity.

BRIEF DESCRIPTION OF THE DRAWINGS

FIG. 2 shows a partial enlargement of the wire portion shown in FIG. 1A.

FIG. 16 shows a plan view of the photomask used in the production process shown in FIG. 15.

FIG. 17 shows an enlarged plan view of the wired circuit board in a modified example of the second embodiment (embodiment in which the rear side is the first linear portion).

DESCRIPTION OF THE EMBODIMENTS

Figure 1A:
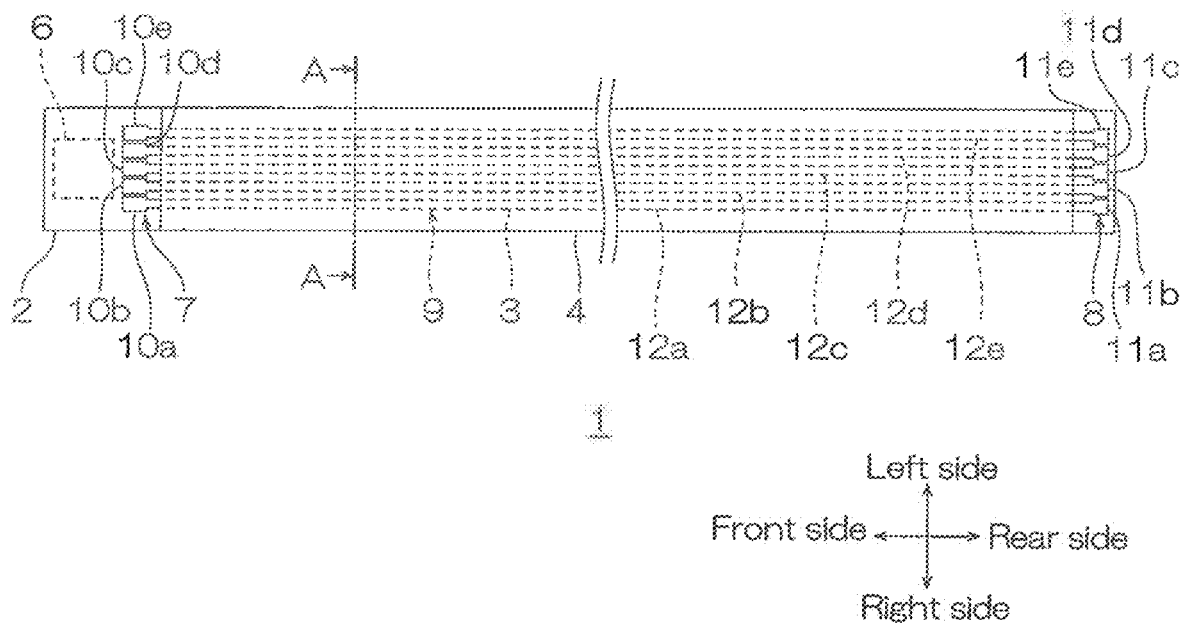
FIG. 1A-FIG. 1B show a first embodiment of the wired circuit board of the present invention, FIG. 1A showing a plan view, and FIG. 1B showing a cross sectional view along A-A of FIG. 1A.

In FIG. 1A, the left-right direction on the sheet of paper is front-rear direction (FPC longitudinal direction), left side on the sheet of paper is front side (one side in the longitudinal direction), and the right side on the sheet of paper is rear side (the other side in longitudinal direction). Up-down direction on the sheet of paper is left-right direction (FPC width direction, orthogonal direction orthogonal to front-rear direction), the lower side on the sheet of paper is right side (one side in FPC width direction), and the upper side on the sheet of paper is left side (the other side in FPC width direction). Paper thickness direction on the sheet of paper is up-down direction (thickness direction, orthogonal direction orthogonal to front-rear direction and left-right direction), the near side on the sheet of paper is upper side (one side in thickness direction) and the far side on the sheet of paper is lower side (the other side in thickness direction). To be specific, the directions are in accordance with the direction arrows in the figures.

First Embodiment

A wired circuit board 1 in the first embodiment of the wired circuit board of the present invention is described with reference to FIG. 1A to FIG. 4.

Figure 1B:
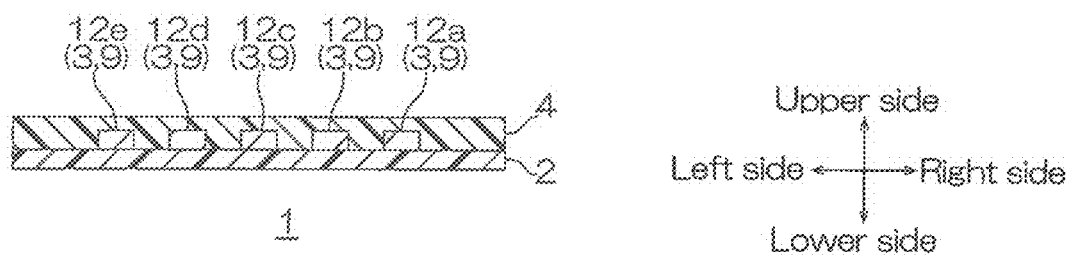

The wired circuit board 1 is a flexible wired circuit board (FPC) elongated in front-rear direction, and as shown in FIG. 1A, it is formed into a flat plate shape (sheet shape) extending in front-rear direction. The wired circuit board 1 includes, as shown in FIG. 1B, an insulating base layer 2 as the first insulating layer, a conductive pattern 3 formed on the insulating base layer 2, and an insulating cover layer 4 as the second insulating layer formed on the conductive pattern 3.

The insulating base layer 2 is formed into a flat plate shape (sheet shape) extending in front-rear direction, and has a contour of the wired circuit board 1.

An electronic component-mount portion 6 for mounting an electronic component 5 (described later) is defined at the front end of the insulating base layer 2.

The insulating base layer 2 is formed from an insulating material. Examples of the insulating material include synthetic resins such as polyimide resin, polyamide-imide resin, acrylic resin, polyether nitrile resin, polyether sulfone resin, polyethylene terephthalate resin, polyethylenenaphthalate resin, and polyvinyl chloride resin. Preferably, the insulating base layer 2 is formed from polyimide resin.

The insulating base layer 2 has a thickness of for example, 3 μm or more, preferably 5 μm or more, and for example, 50 μm or less, preferably 30 μm or less.

The conductive pattern 3 is formed on the upper face (one side in the thickness direction) of the insulating base layer 2. The conductive pattern 3 includes, as shown in FIG. 1A, an electronic component terminal portion 7, external component terminal portion 8, and wire portion 9.

The electronic component terminal portion 7 is a terminal for electrically connecting with an electronic component 5 (described later). The electronic component terminal portion 7 is disposed behind the electronic component-mount portion 6 at the front end of the insulating base layer 2. The electronic component terminal portion 7 includes a plurality of (5) electronic component terminals 10.

The plurality of electronic component terminals 10 are disposed in spaced apart relation from each other in left-right direction. The electronic component terminal 10 is formed into a generally rectangular shape when viewed from the top. The electronic component terminal 10 has a width (left-right direction length) larger than the width of the wire 12 described later (that is, first width W of first linear portion).

The external component terminal portion 8 is a terminal for electrically connecting with an external component (not shown). The external component terminal portion 8 is disposed at the rear end portion of the insulating base layer 2, and includes a plurality of (5) external component terminals 11 corresponding to the plurality of (5) electronic component terminals 10.

The plurality of external component terminals 11 are disposed in spaced apart relation from each other in left-right direction. The external component terminal 11 is formed into a generally rectangular shape when viewed from the top. The external component terminal 11 has a width (left-right direction length) larger than the width of the wire 12 described later (that is, first width W of first linear portion).

The wire portion 9 is disposed between the electronic component terminal portion 7 and the external component terminal portion 8 so as to connect them. The wire portion 9 includes a plurality of (5) wires 12 (12a, 12b, 12c, 12d, 12e) in correspondence with the plurality of (5) electronic component terminal portions 7 and a plurality of (5) external component terminal portions S.

The plurality of wires 12 are formed so as to extend in front-rear direction. The wire 12 is integrally formed with the electronic component terminal 10 and the external component terminal 11 so that the front end edge thereof is continuous with the rear end edge of the electronic component terminal 10, and their end edge is continuous with the front end edge of the external component terminal 11.

The wire portion 9 includes a pattern produced by conducting exposure to light and development a plural times using a wire-photomask 40 (described later), in the production method as described later with reference to FIG. 2 and FIG. 7. That is, in the wire portion 9, a single pattern region in correspondence with a pattern of one set of exposure to light and development (first region, second region, third region, . . . individually) of the wire-photomask 40 continues a plural times in front-rear direction, with a partial overlapping at both ends in front-rear direction. To be specific, the wire portion 9 includes a parallelly arranged linear portion 20 corresponding to the center portion in front-rear direction of the light transmission portion 41 (described later), and a parallelly arranged connection portion 30 corresponding to the overlapping region 43 (described later) of the wire-photomask 40. The wire portion 9 includes a plurality of parallelly arranged linear portions 20 and a plurality of parallelly arranged connection portions 30. That is, the wire portion 9 is formed so that the parallelly arranged linear portion 20 and the parallelly arranged connection portion 30 are alternately continuous in front-rear direction.

As shown in FIG. 2, the parallelly arranged linear portion 20 each includes a plurality of (5) linear portions 21 (21a, 21b, 21c, 21d, 21e) disposed in left-right direction with equal interval therebetween. The plurality of linear portions 21 are formed into a linear pattern each having a predetermined width and extending linearly. The plurality of linear portions 21 (21a, 21b, 21c, 21d, 21e) have substantially the same shape.

The parallelly arranged connection portion 30 each includes a plurality of (5) connection portions 31 (31a, 31b, 31c, 31d, 31e) disposed in left-right direction with an equal interval therebetween. The plurality of connection portions 31 have substantially the same shape, and their widths are formed to be wider than that of the linear portion 21 (21a, 21b, 21c, 21d, 21e).

Next, description is given with reference to FIG. 3 as to one linear portion (hereinafter referred to as first linear portion 22), one connection portion 31 continuous to the rear side of the first linear portion 22, and another linear portion continuous to the rear side of the one connection portion 31 (hereinafter referred to as second linear portion 23), using the wire 12 (12a) at the rightmost in the first region (m-th region) and the second region (m-th+1 region) as an example.

The first linear portion 22 is formed into a linear pattern extending linearly in the first linear direction. The width W of the first linear portion 22 (first width in the first width direction orthogonal to the first linear direction) is substantially the same from the front end to the rear end of the first linear portion 22. The first linear portion 22 has a width W of for example, 10 μm or more, preferably 15 μm or more, and for example, 300 μm or less, preferably 150 μm or less.

The second linear portion 23 is formed into a linear pattern extending linearly in the second linear direction. The width of the second linear portion 23 (second orthogonal length in second width direction orthogonal to the second linear direction) is the same as the width W of the first linear portion 22. The width of the second linear portion 23 is substantially the same from the front end to the rear end of the second linear portion 23. The second linear portion 23 has a substantially the same shape as that of the first linear portion 22, except for the direction the second linear portion 23 extends.

The first linear direction and the second linear direction form an angle θ (0<θ<1 deg, preferably 0.01 deg≤θ≤0.95 deg, more preferably 0.05 deg≤θ≤0.95 deg). To be specific, the first widthwise one end edge 24a of the first linear portion 22 and the second widthwise one end edge 25a of the second linear portion 23 form an angle θ (0<θ<1 deg, preferably 0.01 deg≤θ≤0.95 deg, more preferably 0.05 deg≤θ≤0.95 deg).

The connection portion 31 is disposed between the first linear portion 22 and the second linear portion 23 so as to connect them. The front end edge of the connection portion 31 is continuous with the rear end edge of the first linear portion 22, and the rear end edge of the connection portion 31 is continuous with the front end edge of the second linear portion 23.

The connection portion 31 includes a first side 32, second side 33, third side 34, and fourth side 35.

The first side 32 is formed so as to extend from the first widthwise one end edge 24a of the first linear portion 22 to further extend along the first linear direction. That is, the first side 32 extends from the one end edge in the first linear direction (rear end edge) of the first widthwise one end edge 24a toward the first linear direction one side (rear side). The first side 32 has a length $D_1$ of, for example, 100 μm or more, preferably 500 μm or more, and for example, 10000 μm or less, preferably 5000 μm or less.

The second side 33 is formed so as to extend from the second widthwise other end edge 25b of the second linear portion 23 further along the second linear direction. That is, the second side 33 extends from the other end edge in the second linear direction of the second widthwise other end edge 25b (front end edge) toward the other side in the second linear direction (front side). The second side 33 has a length $D_2$ of, for example, 100 μm or more, preferably 500 μm or more, and for example, 10000 μm or less, preferably 5000 μm or less.

The third side 34 is formed so as to connect the end edge of the first side 32 and the end edge of the second widthwise one end edge 25a of the second linear portion 23, and extend along a first width direction (an example of first-crossing direction crossing the first linear direction and the second linear direction). That is, the third side 34 is a line that connects one end edge in the first linear direction (rear end edge) of the first side 32, with the other end edge in the second linear direction (front end edge) of the second widthwise one end edge 25a of the second linear portion 23. The third side 34 has a length $D_3$ of, for example, 0.1 μm or more, preferably 0.5 μm or more, more preferably 1 μm or more, and for example, 15 μm or less, preferably 10 μm or less.

The fourth side 35 is formed so as to connect the end edge of the second side 33 with the end edge of the first widthwise other end edge 24b of the first linear portion 22, and extend along a second width direction (an example of second-crossing direction crossing the first linear direction and the second linear direction). That is, the fourth side 35 is a line that connects the other end edge in the second linear direction (front end edge) of the second side 33 with one end edge of the first widthwise other end edge 24b in the first linear direction (rear end edge) of the first linear portion 22. The fourth side 35 has a length $D_4$ of, for example, 0.1 μm or more, preferably 0.5 μm or more, more preferably 1 μm or more, and for example, 15 μm or less, preferably 10 μm or less.

The second side 33 forms a first corner portion 36 with the fourth side 35, and its angle is substantially the right angle (for example, 90±0.04 deg, preferably 90±0.01 deg). The first side 32 forms a fourth corner portion 37 with the third side 34, and its angle is substantially the right angle.

The connection portion 31 has a width broader than that of the first linear portion 22 and the second linear portion 23. That is, at the connection portion 31, the first widths of the first side 32 and the second side 33 are longer than the width W of the first linear portion 22.

The connection portion 31 satisfies the relationship of formula (1) below.

$$0 < y_1 < S \quad (1)$$

$Y_1$ represents a length from the first corner portion 36 to the first widthwise other end edge 24b of the first linear portion 22 along the first width direction. That is, it represents the shortest distance of the first width between the first corner portion 36 and the first linear portion 22. $Y_1$ is a dislocation in the first width direction of the second linear portion 23 relative to the first linear portion 22. $Y_1$ is, for example, 0.1 µm or more, preferably 0.5 µm or more, more preferably 1 µm or more, and for example, 15 µm or less, preferably 10 µm or less.

S represents a length along the first width direction from the first widthwise other end edge 24b of the first linear portion 22 in the wire 12a (one wire) to the first widthwise one end edge 24a of the first linear portion 22 in the wire 12b (the other wire). That is, S is a wire interval between the wire 12a and the wire 12b. The other wire is a wire disposed adjacent with a space provided relative to one wire at the other side in the first width direction. S is for example, 10 µm or more, preferably 15 µm or more, and for example, 300 µm or less, preferably 150 µm or less.

The ratio of S to $y_1$ ($S/y_1$) is, for example, 2 or more, preferably 5 or more, and for example, 100 or less, preferably 50 or less.

The connection portion 31 satisfies the relationship of formula (2) below.

$$D_1 \times \tan\theta + y_1 < S \quad (2)$$

At the connection portion 31, length $D_1$ of the first side 32 is the same or longer than the first width W of the first linear portion 22. That is, the relationship of $W \leq D_1$ (3) is satisfied.

Although the wire 12a at the rightmost of the first region and the second region is described above, the same thing applies to the wires (12b to 12e) other than the wire 12a. However, the wire 12e having no "the other wire" disposed at the other side in the first width direction, the formula (1) and formula (2) do not apply.

Figure 4:
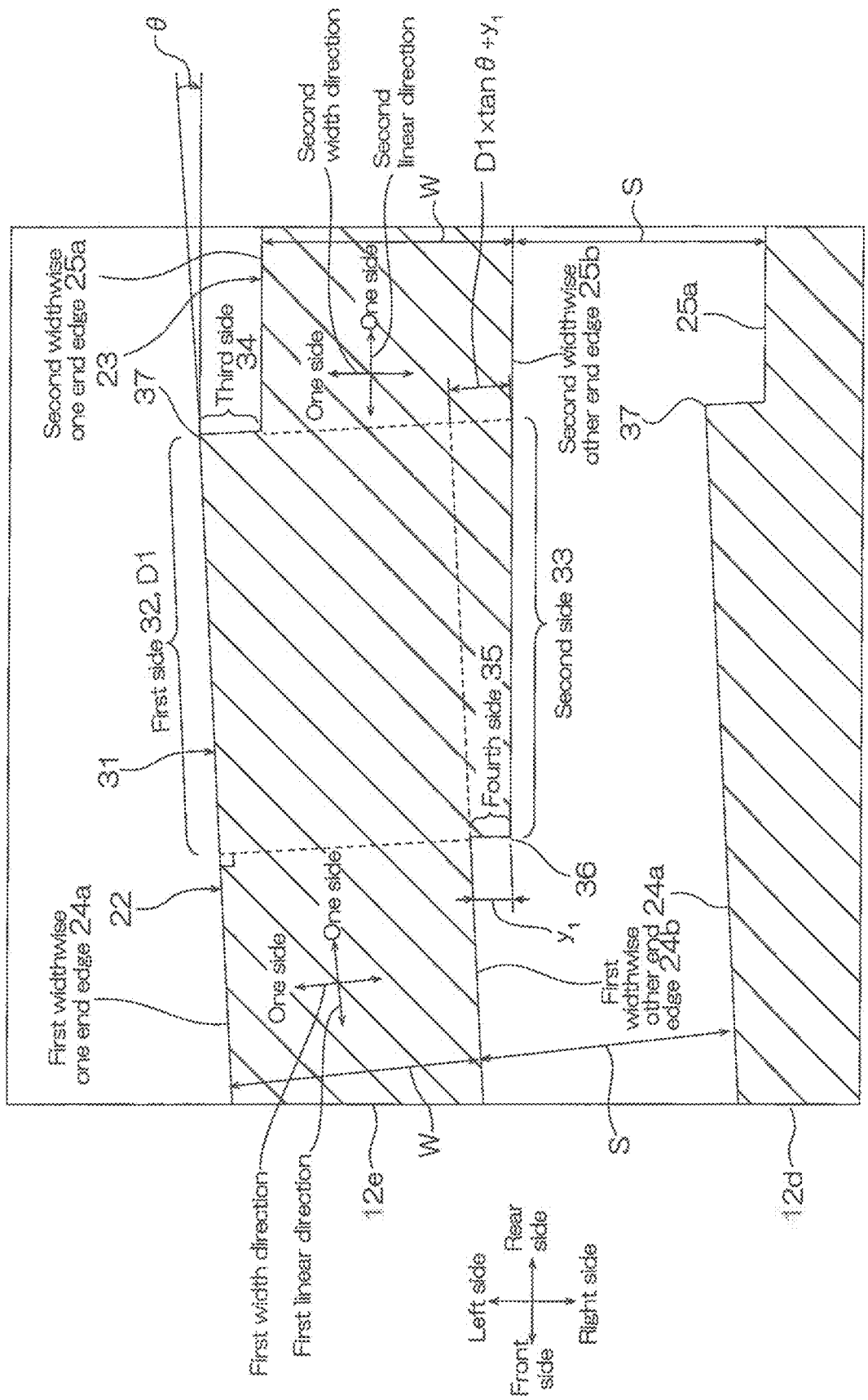
FIG. 4 shows a partial enlargement of the connection portion at the second region and the third region shown in FIG. 2.

The same can be said to the wire 12 in the second region and the third region as well. FIG. 4 shows a partial enlargement of the leftmost wire 12e as an example. In this case, the linear portion of the wire 12 in the second region (in FIG. 4, front side) is regarded as the first linear portion 22, and the linear portion of the wire 12 in the third region (in FIG. 4, rear side) is regarded as the second linear portion 23.

Figure 3:
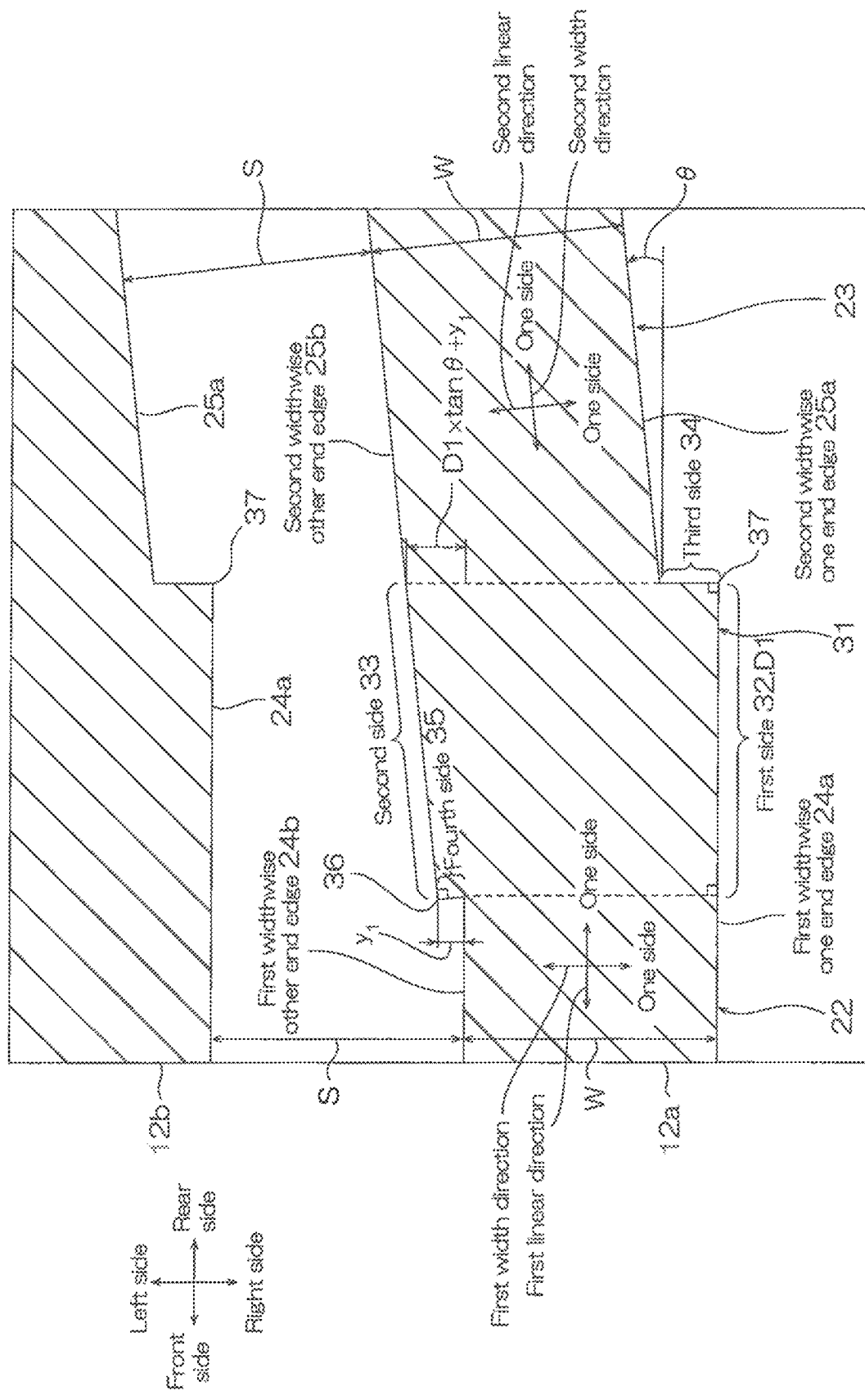
FIG. 3 shows a partial enlargement of the connection portion at the first region and the second region shown in FIG. 2.

As shown in FIG. 3 (relationship between the first region and the second region), with regard to the angle θ formed with the first linear direction of one linear portion and the second linear direction of another linear portion (0<θ<1 deg), when the second linear direction tilts toward the left side relative to the first linear direction, that is, when the circumferential direction from the first linear direction to the second linear direction is counterclockwise, the first widthwise one end edge 24a and the second widthwise one end edge 25a are positioned at the right side, and the first widthwise other end edge 24b and the second widthwise other end edge 25b are positioned at the left side. The other wires 12 (12a to 12e) are wires that are positioned at left side relative to the one wires 12 (12a to 12e).

Meanwhile, as shown in FIG. 4 (relationship between the second region and the third region), with regard to the angle θ formed with first linear direction of one linear portion and second linear direction of another linear portion (0<θ<1 deg), when the second linear direction tilts toward the right side relative to the first linear direction, that is, when the circumferential direction from the first linear direction to the second linear direction is clockwise, the first widthwise one end edge 24a and the second widthwise one end edge 25a are positioned at the left side, and the first widthwise other end edge 24b and the second widthwise other end edge 25b are positioned at the right side. The other wires 12 (12a to 12e) are wires 12 that are positioned at right side relative to the one wires 12 (12a to 12e).

The wire length of the wire portion 9 (front-rear direction length) is, for example, 600 mm or more, preferably 800 mm or more, and for example, 5000 mm or less, preferably 3000 mm or less.

The insulating cover layer 4 is disposed, as shown in FIG. 1B, on the conductive pattern 3. To be specific, the insulating cover layer 4 is disposed at the upper face of the insulating base layer 2 so as to cover the upper face and the side face of the conductive pattern 3. The insulating cover layer 4 is formed so as to allow the electronic component-mount portion 6, electronic component terminal portion 7, and external component terminal portion 8 to expose, and cover the wire portion 9. That is, the insulating cover layer 4 is formed into a generally rectangular shape elongated in front-rear direction when viewed from the top, from the rear side of the electronic component terminal portion 7 to the front side of the external component terminal portion 8.

The insulating cover layer 4 is formed from the same insulating material described above for the insulating material of the insulating base layer 2, and preferably, is formed from polyimide resin.

The insulating cover layer 4 has a thickness of, for example, 1 µm or more, preferably 3 µm or more, and for example, 50 µm or less, preferably 30 µm or less.

Production Method in First Embodiment

A method for producing a wired circuit board 1 is described with reference to FIG. 5A to FIG. 7. The wired circuit board 1 is produced by semiadditive method, and for example, includes a first step, in which an insulating base layer 2 is prepared, a second step, in which a conductive pattern 3 is formed on the surface of the insulating base layer 2, and a third step, in which an insulating cover layer 4 is formed on the surface of the conductive pattern 3.

(First Step)

Figure 5A:
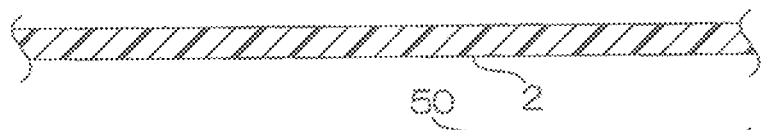
FIG. 5A-FIG. 5I show process diagram of the method for producing a wired circuit board shown in FIG. 1A, FIG. 5A illustrating a step of preparing an insulating base layer, FIG. 5B illustrating a step of forming a metal thin film, FIG. 5C illustrating a step of forming a photo resist, FIG. 5D illustrating a step of exposing the photo resist to light, FIG. 5E illustrating a step of developing the photo resist, FIG. 5F illustrating a step of forming wires, FIG. 5G illustrating a step of removing the photo resist, FIG. 5H illustrating a step of removing the metal thin film, and FIG. 5I illustrating a step of forming an insulating cover layer.

In the first step, as shown in FIG. 5A, an insulating base layer 2 elongated in front-rear direction is prepared.

When a plurality of the wired circuit boards 1 are formed simultaneously, the insulating base layer 2 does not have to be elongated in the first step, and the insulating base layer 2 is trimmed to be elongated to have the contour of the wired circuit board 1 in the final step.

(Second Step)

In the second step, a conductive pattern 3 is formed on the surface of the insulating base layer 2. That is, the electronic component terminal portion 7, wire portion 9, and external component terminal portion 8 are formed on the upper face of the insulating base layer 2.

To be specific, the second step includes a step (1), in which the metal thin film 50 is formed on the surface of the insulating base layer 2, a step (2), in which the photo resist 51 is formed on the surface of the metal thin film 50, a step (3), in which the photo resist 51 is exposed to light with a photomask interposed therebetween, a step (4), in which the metal thin film 50 is exposed by development, a step (5), in which the conductive pattern 3 is formed by plating on the surface of the metal thin film 50 exposed, and a step (6), in which the metal thin film 50 facing the remaining photo resist 51, and the remaining photo resist 51 are removed.

Step (1)

Figure 5B:

As shown in FIG. 5B, the metal thin film 50 is formed on the surface of the insulating base layer 2.

To be specific, on the entire upper face of the insulating base layer 2, a metal thin film 50 (seed film) is formed. For the metal thin film 50, a metal material such as copper, chromium, nickel, and alloys thereof are used. The metal thin film is formed by thin film forming methods such as sputtering and plating. Preferably, the metal thin film 50 is formed by sputtering.

The metal thin film 50 has a thickness of, for example, 10 nm or more, and 300 nm or less.

Step (2)

Figure 5C:
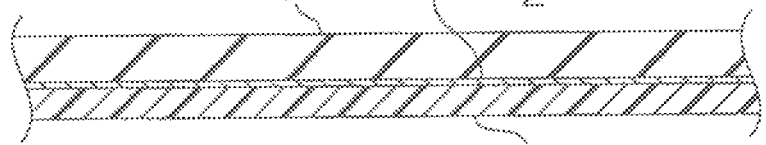

As shown in FIG. 5C, a photo resist 51 is formed on the surface on the metal thin film 50.

The photo resist 51 is a positive type photo resist (positive photo resist). With the positive type photo resist, a portion where a predetermined amount or more of light is applied at the time of light exposure is removed in the development thereafter, and meanwhile, a portion where the light is shielded (portion where a predetermined amount or more of light was not applied, that is, portion where application of less than a predetermined amount of light was allowed) remains in the development thereafter. The photo resist 51 includes, for example, a dry film resist.

To be specific, the photo resist 51 is formed on the entire upper face of the metal thin film 50. For example, the dry film resist is pressed (push against) by using for example, a flat plate.

The photo resist 51 has a thickness of, for example, 10 μm or more, and 50 μm or less.

Step (3)

Figure 5D:
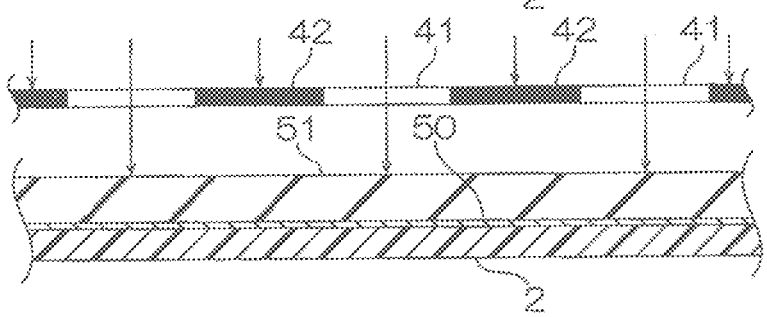

As shown in FIG. 5D, the photo resist 51 is exposed to light with a photomask interposed therebetween.

For the photomask, a wire-photomask 40 and a terminal-photomask (not shown) are prepared.

Figure 6:
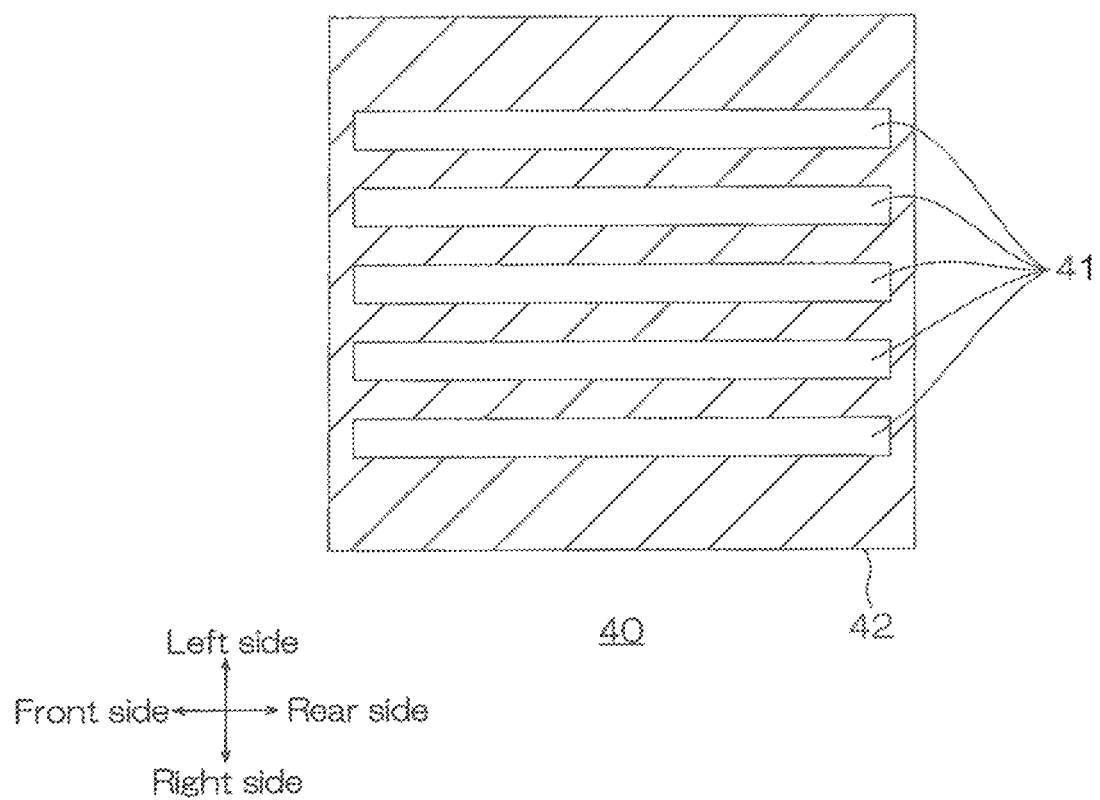
FIG. 6 shows a plan view of the photomask used in the production process shown in FIG. 5.

As shown in FIG. 6, the wire-photomask 40 is formed into a generally rectangular shape when viewed from the top.

The wire-photomask 40 has, for example, a light transmission portion 41 and a shield portion 42.

The light transmission portion 41 is formed into a pattern of a plurality of (5) straight lines arranged in parallel corresponding to a plurality of (5) wires 12. To be specific, the light transmission portion 41 includes a plurality of (5) light-transmitting regions having a generally rectangular shape when viewed from the top extending linearly in front-rear direction, and the plurality of light-transmitting regions have the same shape and arranged in parallel with a space provided therebetween in left-right direction. The light transmission portion 41 is formed from, for example, a light transmitting material such as glass plate, or is formed with openings.

The shield portion 42 defines a portion other than the light transmission portion 41 in the wire-photomask 40, and is formed from a shield material such as metal plate.

The terminal-photomask (electronic component terminal-photomask, external component terminal-photomask) has a light transmission portion corresponding to the electronic component terminal portion 7 or external component terminal portion 8.

Then, the photomask is disposed to face the surface of the photo resist 51, and the photo resist 51 is exposed to light with a photomask interposed therebetween.

To be specific, the photomasks (wire-photomask 40, electronic component end portion-photomask, and external component-photomask) are placed to face the surface of the upper side of the photo resist 51 with a space provided therebetween, and the photo resist 51 is exposed to light.

To expose the photo resist 51 to light, light is applied to the photomask from a light source placed above the photomask. Then, the light applied to the shield portion 42 of the photomask is shielded by the shield portion 42, and does not reach the photo resist 51. Meanwhile, the light applied to the light transmission portion 41 of the photomask passes through the light transmission portion 41 and reaches the photo resist 51.

Figure 7:
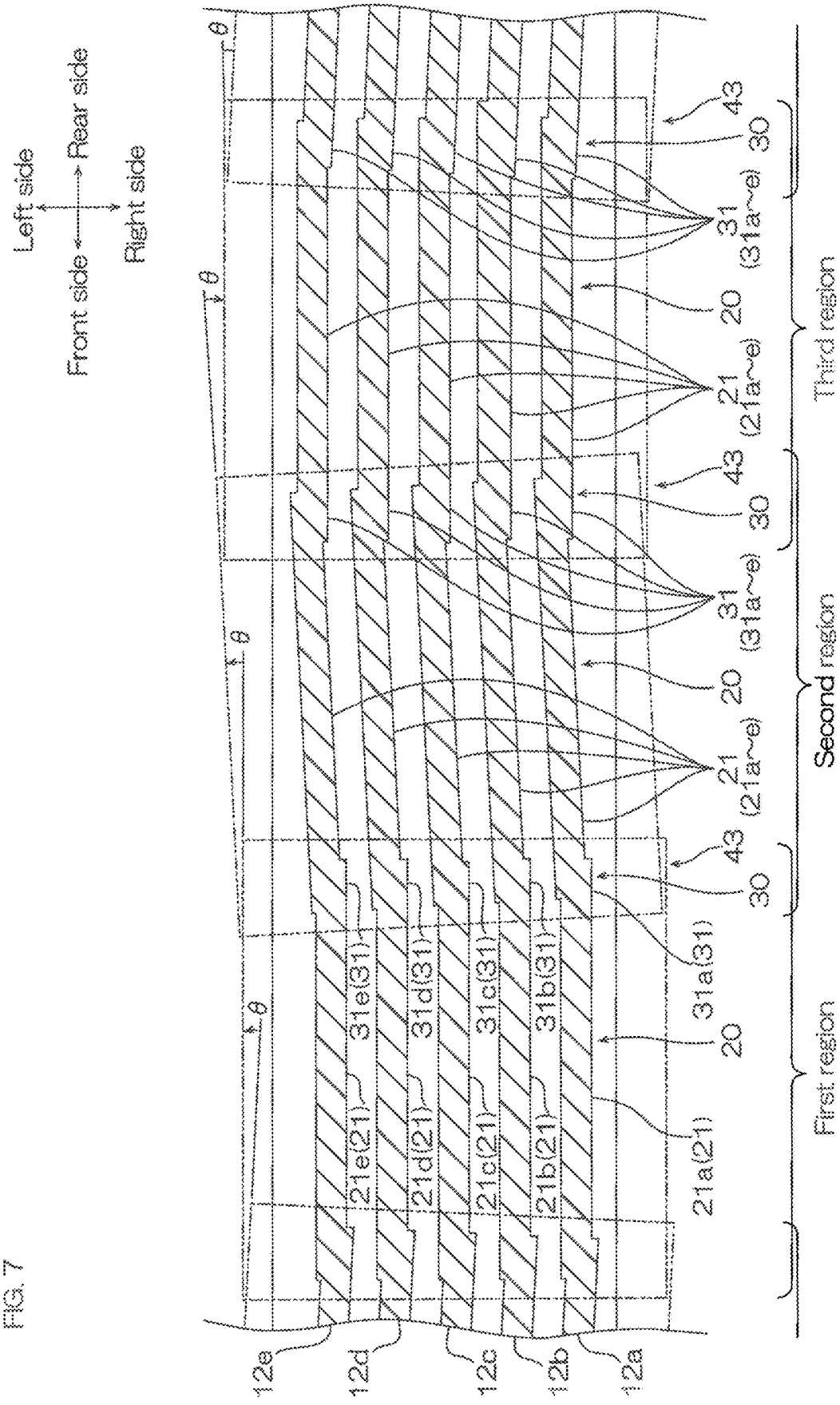
FIG. 7 shows a photomask placement.

As shown in FIG. 7, when the pattern of the wire portion 9 is exposed to light through the wire-photomask 40, light exposure is conducted a plurality of times (n times) while shifting the wire-photomask 40 in front-rear direction one after another (for example, first linear direction) so that the connection portion 31 is formed in each of the wires 12.

To be specific, the wire-photomask 40 is disposed so that in each exposure process of the wire portion 9, the rear end of the linear pattern of the light transmission portion 41 in the wire-photomask 40 (one end portion in first linear direction) in the previous exposure process (for example, m-th exposure process) overlaps with the front end of the linear pattern of the light transmission portion 41 in the wire-photomask 40 (the other end portion in second linear direction) in the following exposure process (for example, m-th+1). That is, the wire-photomask 40 is disposed with shifting in front-rear direction so that an overlapping region 43 is formed: in the overlapping region 43, the region corresponding to the position where the previous wire-photomask 40 is disposed overlaps the region where the following wire-photomask 40 is disposed.

Furthermore, it is disposed so that the second linear direction relative to the first linear direction, and the front end of the previous wire-photomask 40 relative to the rear end of the following wire-photomask 40 are shifted a little in left-right direction (that is, in the range of length $y_1$).

Also, the wire-photomask 40 is disposed so that a predetermined angle θ (0<θ<1 deg) is formed with the linear pattern of the light transmission portion 41 in the wire-photomask 40 of the previous light exposure process and the linear pattern of the light transmission portion 41 of the wire-photomask 40 in the following light exposure process.

In this manner, by conducting the following steps (development process, wire-forming process), in the overlapping region 43 where the previous photomask overlaps with the following photomask, a connection portion 31 with a narrower width than that of the linear pattern is formed at the first width. Also, the linear portion 21 corresponding to the linear pattern is formed with the adjacent two overlapping regions 43.

When the second linear direction tilts toward the left side relative to the first linear direction, and when the circumferential direction from the first linear direction to the second linear direction is counterclockwise in FIG. 7, the front end of the previous wire-photomask 40 is disposed to shift a little to the left side (the other side in the first width direction) relative to the rear end of the following wire-photomask 40 (that is, to achieve length $y_1$) (ref: FIG. 3). Meanwhile, when the second linear direction tilts toward the right side relative to the first linear direction, that is, when the circumferential direction from the first linear direction to the second linear direction is clockwise in FIG. 7, the front end of the previous wire-photomask 40 is disposed to shift a little to the right side (one side in the first width direction) relative to the rear end of the following wire-photomask 40 (that is, to achieve length $y_1$) (ref: FIG. 4). Preferably, the light exposure time (n/2 times) is substantially the same to achieve the positioning shown in FIG. 3 and the positioning shown in FIG. 4.

As necessary, for precise positioning of the photomask, an alignment mark can be provided on the under layers such as the metal thin film 50 and the insulating base layer 2, and the wire-photomask 40.

The wire portion 9 can be subjected to the light exposure by the light exposure time n of for example, 2 or more, preferably 3 or more, and for example, 18 or less, preferably 12 or les.

Step (4)

Figure 5E:
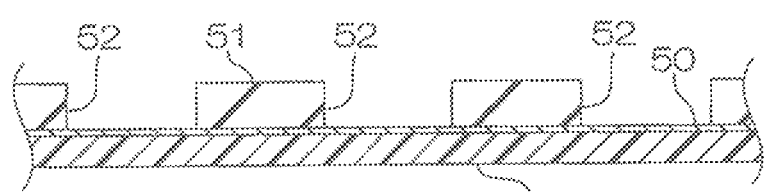

As shown in FIG. 5E, the metal thin film 50 is exposed by development.

That is, the photo resist 51 facing the light transmission portion 41 is removed.

To be specific, first, as necessary, the photo resist 51 after exposure to light is heated (heating after light exposure).

Then, the photo resist 51 is developed with a developer. This causes, in the photo resist 51, the portion other than the light transmission portion 41 (unexposed portion) to remain, and only the light transmission portion 41 (exposed portion) to be removed. That is, in the photo resist 51, the opening 52 corresponding to the light transmission portion 41 is formed. The opening 52 penetrates the photo resist 51 in the thickness direction.

This causes the metal thin film corresponding to the light transmission portion 41, that is, the metal thin film 50 facing the opening 52, to be exposed.

Step (5)

Figure 5F:
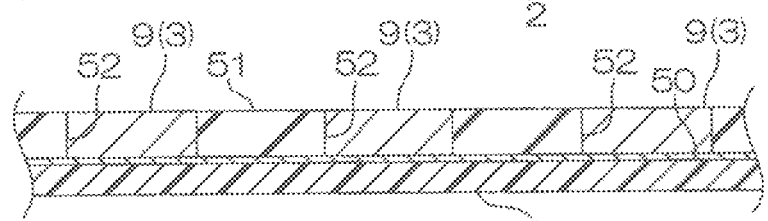

As shown in FIG. 5F, the conductive pattern 3 is formed on the surface of the exposed metal thin film 50 by plating.

To be specific, for example, electrolytic plating is conducted with electricity supplied from the metal thin film 50.

At this time, the photo resist 51 is used as a plating resist. The metal thin film is used as an electric power supply layer.

In this manner, the conductive pattern 3 having the electronic component terminal portion 7, wire portion 9 (a plurality of wires 12), and external component terminal portion 8 is formed.

Step (6)

The remaining photo resist 51 and the metal thin film 50 facing the remaining photo resist 51 are removed.

Figure 5G:
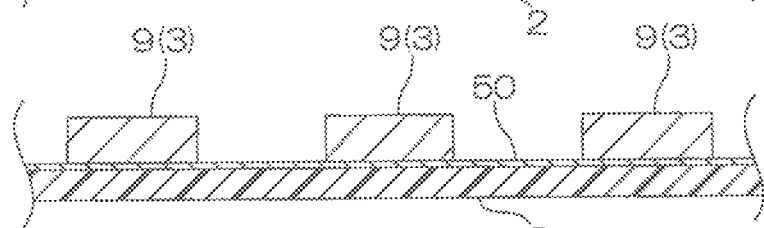

To be specific, fit as shown in FIG. 5G, the remaining photo resist 51 is removed. For example, it is removed by wet etching.

Figure 5H:
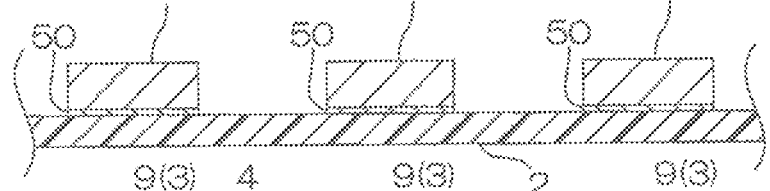

Then, as shown in FIG. 5H, the metal thin film 50 facing the remaining photo resist 51 is removed. To be specific, it is removed by peeling or wet etching.

(Third Step)

Figure 5I:
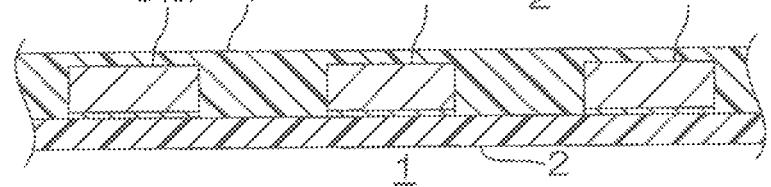

In the third step, as shown in FIG. 5I, the insulating cover layer 4 is formed on the surface of the wire portion 9.

To be specific, as shown in FIG. 5I and FIG. 1B, the insulating cover layer 4 is provided on the upper face of the wire portion 9 and the insulating base layer 2 so that a pattern is formed so as to cover the upper face and side face of the wire portion 9 and to expose the electronic component terminal portion 7 and the external component terminal portion 8.

The wired circuit board 1 including the insulating base layer 2, conductive pattern 3, and insulating cover layer 4 is produced in this manner.

Such a wired circuit board 1 is used, for example, for a wired circuit board for catheters. To be specific, the electronic component 5 is mounted on the electronic component-mount portion 6, and the electronic component 5 is electrically connected with the electronic component terminal portion 7 by wire bonding. Afterwards, the wired circuit board 1 is stored inside the catheter tube 60.

Examples of the electronic component 5 include those electronic components necessary for examination and treatment, including a pressure sensor, temperature sensor, and heating element.

Figure 8A:
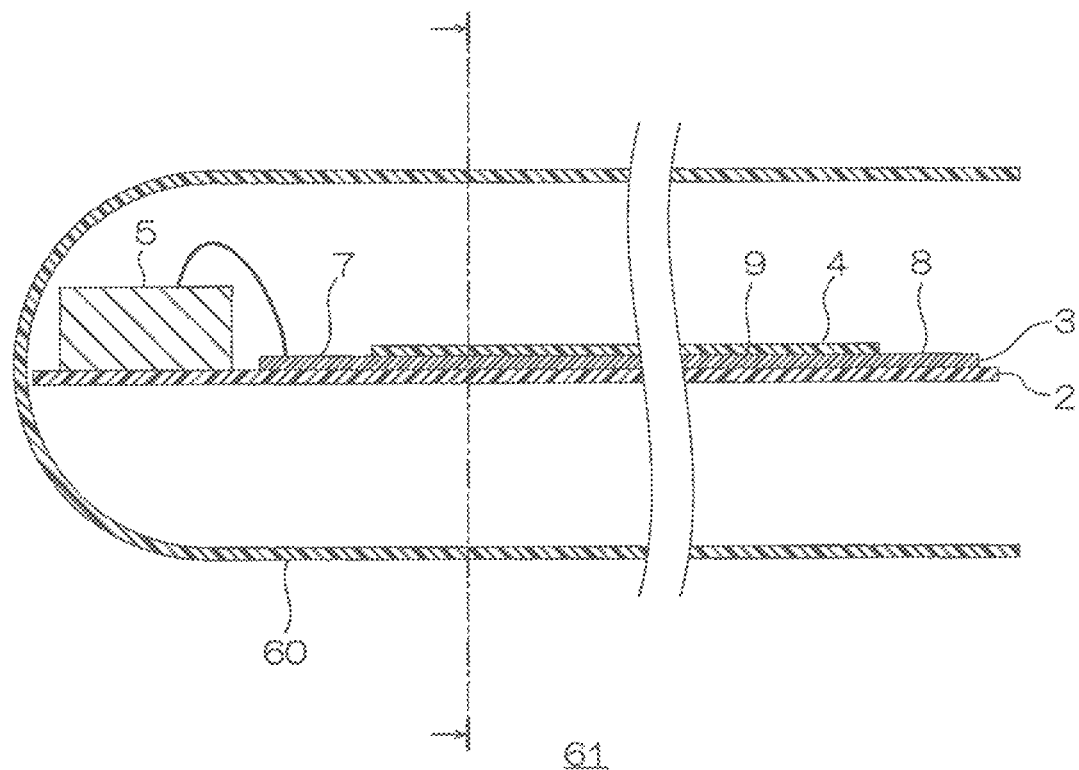
FIG. 8A-FIG. 8B show the catheter including the wired circuit board shown in FIG. 1A, FIG. 8A illustrating a side cross sectional view along the front-rear direction, and FIG. 8B illustrating a cross sectional view along A-A in FIG. 8A.
Figure 8B:
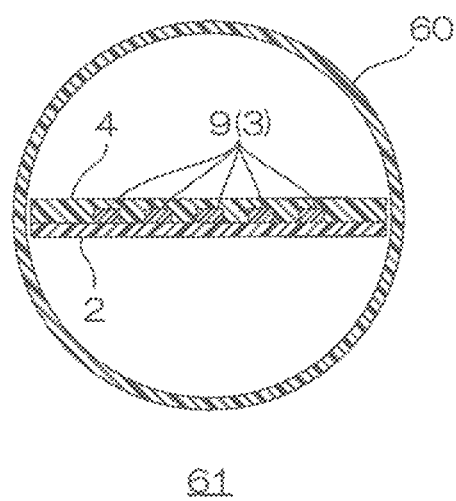

In this manner, as shown in FIG. 8A-FIG. 8B, a catheter 61 including the electronic component 5, wired circuit board 1, and catheter tube 60 is obtained.

Operation and Effect of First Embodiment

In the wired circuit board 1, a plurality of wires 12 each includes (1) first linear portion 22 extending in the first linear direction, (2) second linear portion 23 having the same width as that of the first linear portion 22, disposed at one side in the first linear direction of the first linear portion 22, and extending in the second linear direction so as to have a predetermined angle θ relative to the first linear portion 22, and (3) connection portion 31 disposed between the first linear portion 22 and the second linear portion 23, continuous with these linear portions 22 and 23, and having a width broader than that of these linear portions 22 and 23. The connection portion 31 includes (1) first side 32 extending from the first widthwise one end edge 24a of the first linear portion 22 further along the first linear direction, (2) second side 33 extending from the second widthwise other end edge 25b of the second linear portion 23 further along the second linear direction, (3) third side 34 connecting the first side 32 with the second linear direction end edge of the second widthwise one end edge 25a of the second linear portion 23, and extending along the first width direction, and (4) fourth side 35 connecting the second side 33 with the first linear direction end edge of the first widthwise other end edge 24b of the first linear portion 22, and extending along the second width direction. The relationships of $0<y_1<S$ and $0<θ<1$ deg are satisfied. $Y_1$ represents a length from the first corner portion 36 to the first widthwise other end edge 24b of the first linear portion 22 along the first width direction. S represents a length from the first widthwise other end edge 24b of the first linear portion 22 of one wire 12a to the first widthwise one end edge 24a of the first linear portion 22 of the other wire 12b along the first width (wire interval) in two wires 12 adjacent to each other.

Thus, length $y_1$ from the first corner portion 36 to the first linear portion 22, and length S (wire interval) from the first linear portion 22 of one wire 12a to the first linear portion 22 of the other wire 12b satisfy $0<y_1<S$. That is, at the connection portion 31 between the first linear portion 22 and the second linear portion 23, the widthwise dislocation between the first linear portion 22 and the second linear portion 23 is shorter than the wire interval S. Also, the predetermined angle θ satisfies $θ<1$ deg. That is, the angle formed with the first linear portion 22 and the second linear portion 23 is small. Thus, even if the wire 12a is formed to be elongated, linearity can be secured, short circuit between adjacent wires 12b can be suppressed, and connection reliability is excellent.

Also, the predetermined angle θ satisfies $0<θ$. That is, the angle formed with the linear direction of the first linear portion 22 and the linear direction of the second linear portion 23 is small. Thus, strict adjustment for the angle formed with the first linear portion 22 and the second linear portion 23 is unnecessary, and therefore productivity is excellent.

In the wired circuit board, the length $D_1$ of the first side 32 and the length S satisfy the relationship $D_1 \times \tan θ + y_1 < S$.

Thus, at the connection portion 31 between the first linear portion 22 and the second linear portion 23, short circuit can be suppressed more reliably.

When the above-described formulas are not satisfied, that is, when $D_1 \times \tan θ + y_1 > S$, the second widthwise other end edge 25b of the second linear portion 23 of one wire 12a makes contact with the fourth corner portion 37 of the other wire 12b. That is, a short circuit occurs between the wire 12a and the wire 12b.

In the wired circuit board, the length $D_1$ and the first width W of the first linear portion 22 satisfy the relationship $W \leq D_1$.

Thus, at the connection portion 31, the front-rear direction length of the connection portion 31 is sufficiently long. Therefore, the electric signal easily flows in the front-rear direction (elongated direction) while widthwise flow is suppressed at the connection portion 31. Thus, propagation of electric signals is excellent.

The wired circuit board 1 includes the insulating base layer 2, conductive pattern 3 provided on the upper face of the insulating base layer 2, and insulating cover layer 4 provided on the upper face of the conductive pattern 3, and the conductive pattern 3 includes the wire 12.

Thus, the insulating base layer 2, wire 12, and insulating base layer 2 are disposed so as to make contact in this order. Thus, no adhesive layer is necessary. As a result, moisture and heat resistance is excellent, and the thickness can be decreased.

When the wire length of the wire portion 9 is 600 mm or more in the wired circuit board 1, it can be suitably used as a wired circuit board for catheters.

Modified Example of the First Embodiment

Modified example of the first embodiment is described next. In the following figures, the members that are the same as the above-described ones are given the same reference numerals, and descriptions thereof are omitted.

Figure 9:
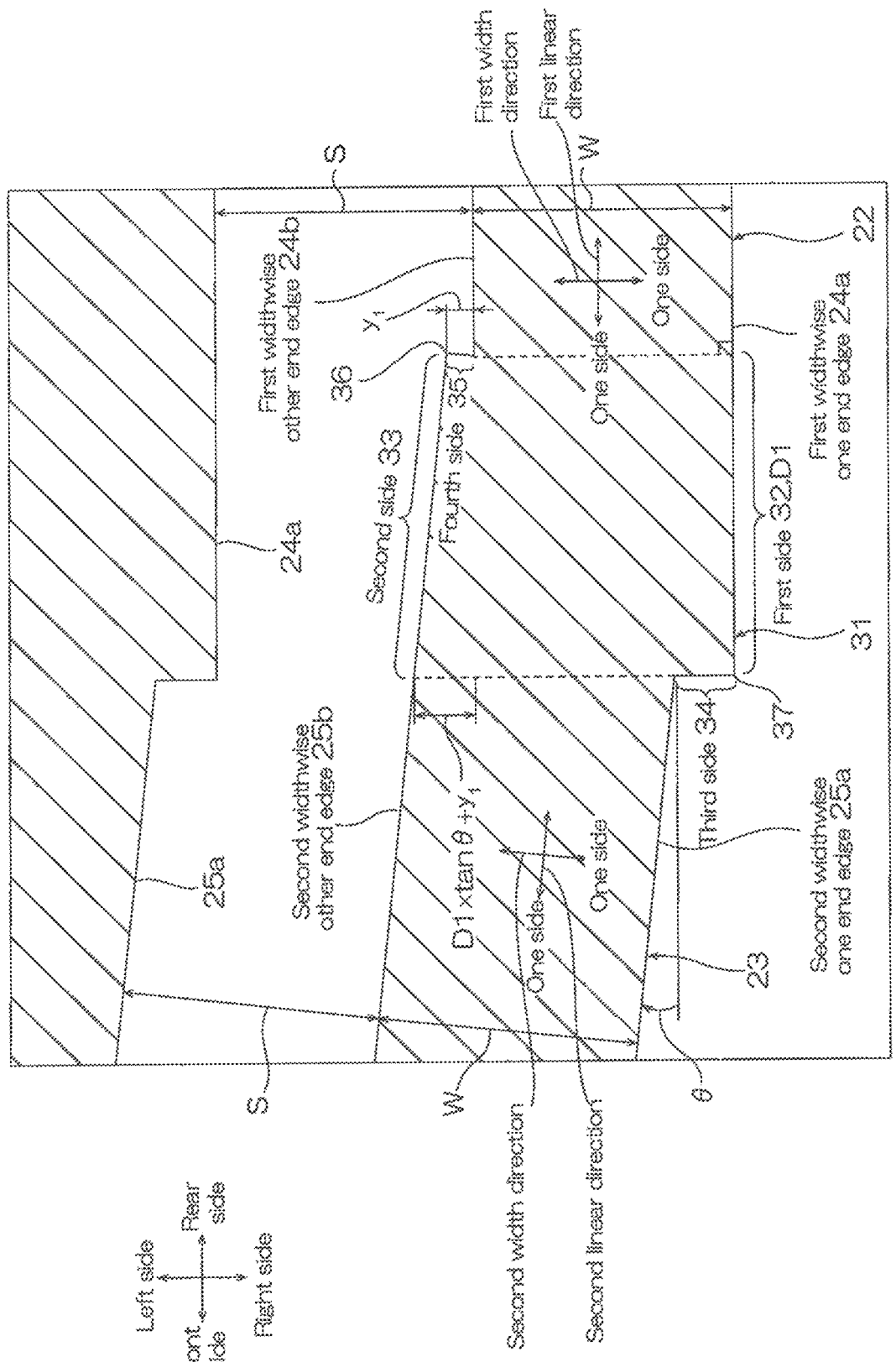
FIG. 9 shows an enlarged plan view of the wired circuit board in a modified example (embodiment in which the rear side is the first linear portion) of the first embodiment.

(1) In the embodiment shown in FIG. 3, the front side is the first linear portion 22, and the rear side is the second linear portion 23, but as shown in FIG. 9, for example, the rear side can be the first linear portion 22, and the front side can be the second linear portion 23. In the embodiment shown in FIG. 4, the front side is the first linear portion 22, and the rear side is the second linear portion 23, but for example, although not shown, the rear side can be the first linear portion 22, and the front side can be the second linear portion 23.

Figure 10:
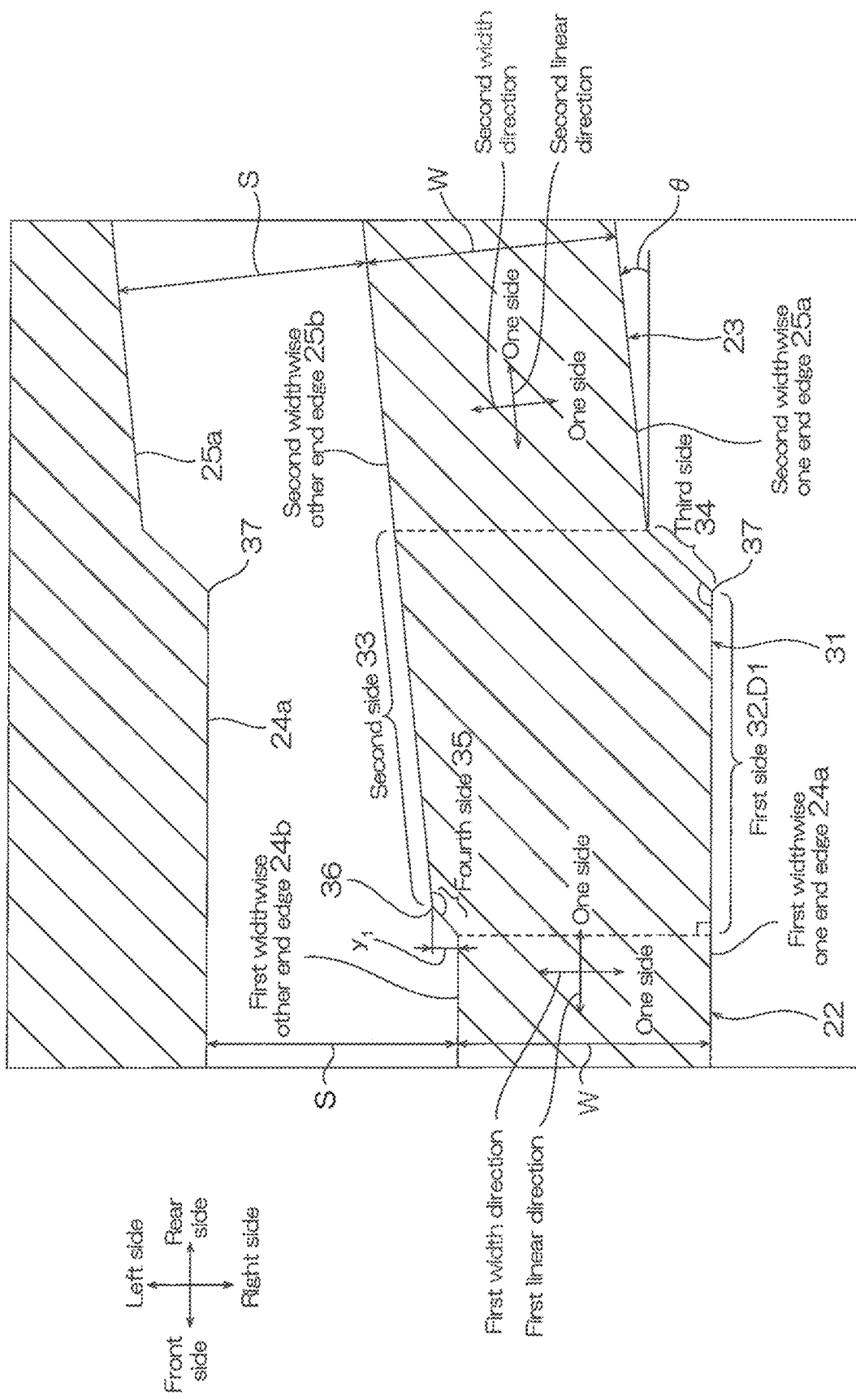
FIG. 10 shows an enlarged plan view of the wired circuit board in a modified example (embodiment in which the first corner portion and the fourth corner portion form an obtuse angle) of the first embodiment.

(2) In the embodiment shown in FIG. 3, the angles of the first corner portion 36 and fourth corner portion 37 are substantially right angle, but as shown in FIG. 10, for example, the angles for the first corner portion 36 and fourth corner portion 37 can be an obtuse angle.

In the embodiment shown in FIG. 10, the angles for the first corner portion 36 and fourth corner portion 37 are more than 90°, preferably 100° or more, and for example, 160° or less, preferably 140° or less.

The third side 34 is formed so as to connect the end edge of the first side 32 with the end edge of the second widthwise one end edge 25a of the second linear portion 23, and to extend along the first-crossing direction crossing the first linear direction and the second linear direction.

The fourth side 35 is formed so as to connect the end edge of the second side 33 with the end edge of the first widthwise other end edge 24b of the first linear portion 22, and to extend along the second-crossing direction crossing the first linear direction and the second linear direction.

In this embodiment as well, preferably, as an approximate value, the relationship of formula (2) and (3) is satisfied.

In the embodiment shown in FIG. 10, it is produced by adjusting light exposure angle and amount at the front-rear direction end portion of the light transmission portion 41 in the light exposure process shown in FIG. 5D.

(3) In the embodiment shown in FIG. 2, the plurality of linear portions 21 (21a, 21b, 21c, 21d, 21e) each has the same first width W, but for example, although not shown, the plurality of linear portions 21 (21a, 21b, 21c, 21d, 21e) each can have a different first width W.

In this embodiment, in step (3), light exposure is conducted by using a wire-photomask 40 (not shown) having a different length in the plurality of linear pattern left-right direction length of the light transmission portion 41.

(4) In the embodiment shown in FIG. 2, a plurality of wire intervals S are all the same length, but for example, although not shown, the plurality of wire intervals S can be different.

In this embodiment, in step (3), light exposure is conducted by using a wire-photomask 40 (not shown) having a different left-right direction interval in a plurality of linear patterns adjacent to each other.

(5) In the embodiment shown in shown in FIG. 1A, a support substrate is not included, but for example, although not shown, a support substrate such as a metal plate can be included at a portion of the lower face (the other side in thickness direction) of the insulating base layer 2. To be specific, for example, the support substrate is disposed at the lower face of the insulating base layer 2 corresponding the electronic component-mount portion 6 and the electronic component terminal portion 7.

(6) In the light exposure process and development process of the embodiment shown in the FIG. 5D and FIG. 5E, the photomask is used for light exposure, and the photo resist 51 is developed in all the formation of the conductive pattern 3, but for example, although not shown, the photo resist 51 can be developed by using a laser direct imaging in the formation of a portion of the conductive pattern 3.

To be specific, for example, the electronic component terminal portion 7 and/or external component terminal portion 8 can be formed by developing the photo resist by using a laser direct imaging. A portion of the wire portion 9 (for example, a portion of the plurality of regions) can be formed by developing the photo resist 51 using the laser direct imaging.

(7) In FIGS. 2 and 7, in all of the plurality of the parallelly arranged linear portions 20, the linear portions 21 of two adjacent parallelly arranged linear portions 20 form an angle θ (0<θ<1 deg), but for example, although not shown, in a portion of the parallelly arranged linear portions 20, the angle formed by the linear portions 21 of the two adjacent parallelly arranged linear portions 20 can be 0 deg, or it can be more than 1 deg.

Preferably, the region where the linear portions 21 of the two adjacent parallelly arranged linear portions 21 form the angle θ (0<θ<1 deg) is preferably 50% or more, more preferably 80% or more, even more preferably 100%, relative to the entire region of the two adjacent parallelly arranged linear portions 21.

In the embodiments of these (1) to (7) as well, the same operation and effect of the embodiments in the above-described FIG. 1A to FIG. 7 can be achieved.

Second Embodiment

With reference to FIG. 11 to FIG. 14, the wired circuit board 1 as the second embodiment of the wired circuit board of the present invention is described. In the following figures, the members that are the same as the above-described ones are given the same reference numerals, and descriptions thereof are omitted.

Figure 11:
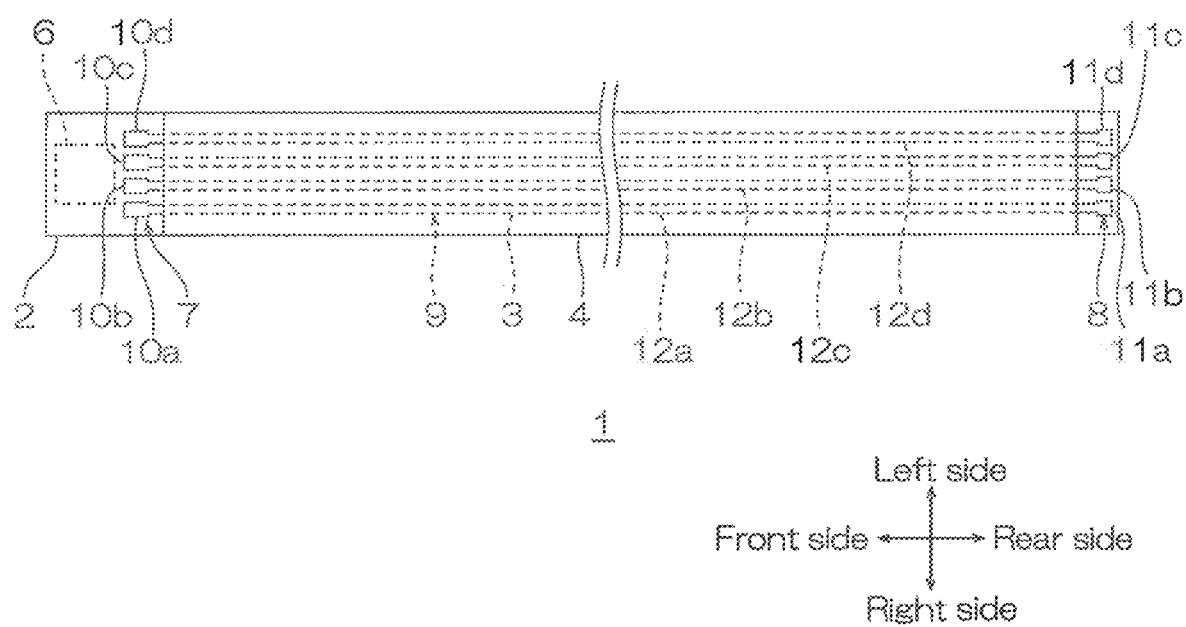
FIG. 11 shows a plan view of the wire portion of the wired circuit board in the second embodiment of the present invention.

As shown in FIG. 11, the wired circuit board 1 is a flexible wired circuit board (FPC) elongated in front-rear direction, and is formed into a flat plate shape extending in (sheet shape) front-rear direction. The wired circuit board 1 includes, as shown in FIG. 1B, an insulating base layer 2, conductive pattern 3 formed on the insulating base layer 2, and insulating cover layer 4 formed on the conductive pattern 3.

The conductive pattern 3 is formed on the upper face of the insulating base layer 2. The conductive pattern 3 includes, as shown in FIG. 11, an electronic component terminal portion 7, external component terminal portion 8, and wire portion 9.

The electronic component terminal portion 7 includes a plurality of (4) electronic component terminals 10.

The external component terminal portion 8 includes a plurality of (4) external component terminals 11.

The wire portion 9 is disposed between the electronic component terminal portion 7 and the external component terminal portion 8 so as to connect them. The wire portion 9 includes a plurality of (4) wires 12 (12a, 12b, 12c, 12d) in correspondence with the plurality of (4) electronic component terminal portions 7 and a plurality of (4) external component terminal portions S.

The plurality of wires 12 are formed so as to extend in front-rear direction. The wire 12 is integrally formed with the electronic component terminal 10 and the external component terminal 11 so that the front end edge thereof is continuous with the rear end edge of the electronic component terminal 10, and their end edge is continuous with the front end edge of the external component terminal 11.

The wire portion 9 includes a pattern produced by conducting exposure to light and development a plural times using a wire-photomask 40 in the production method as described later with reference to FIG. 12. That is, in the wire portion 9, a single pattern region in correspondence with a pattern of one set of exposure to light and development (first region, second region, third region, . . . individually) of the wire-photomask 40 continues a plural times in front-rear direction, with a partial overlapping at both ends in front-rear direction. To be specific, the wire portion 9 includes a parallelly arranged linear portion 20 corresponding to the center portion in front-rear direction of the shield portion 42, and a parallelly arranged connection portion 30 of the overlapping region 43 of the wire-photomask 40. The wire portion 9 is formed from a plurality of parallelly arranged linear portions 20 and a plurality of parallelly arranged connection portions 30. That is, the wire portion 9 is formed so that the parallelly arranged linear portion 20 and the parallelly arranged connection portion 30 are alternately continuous in front-rear direction.

Figure 12:
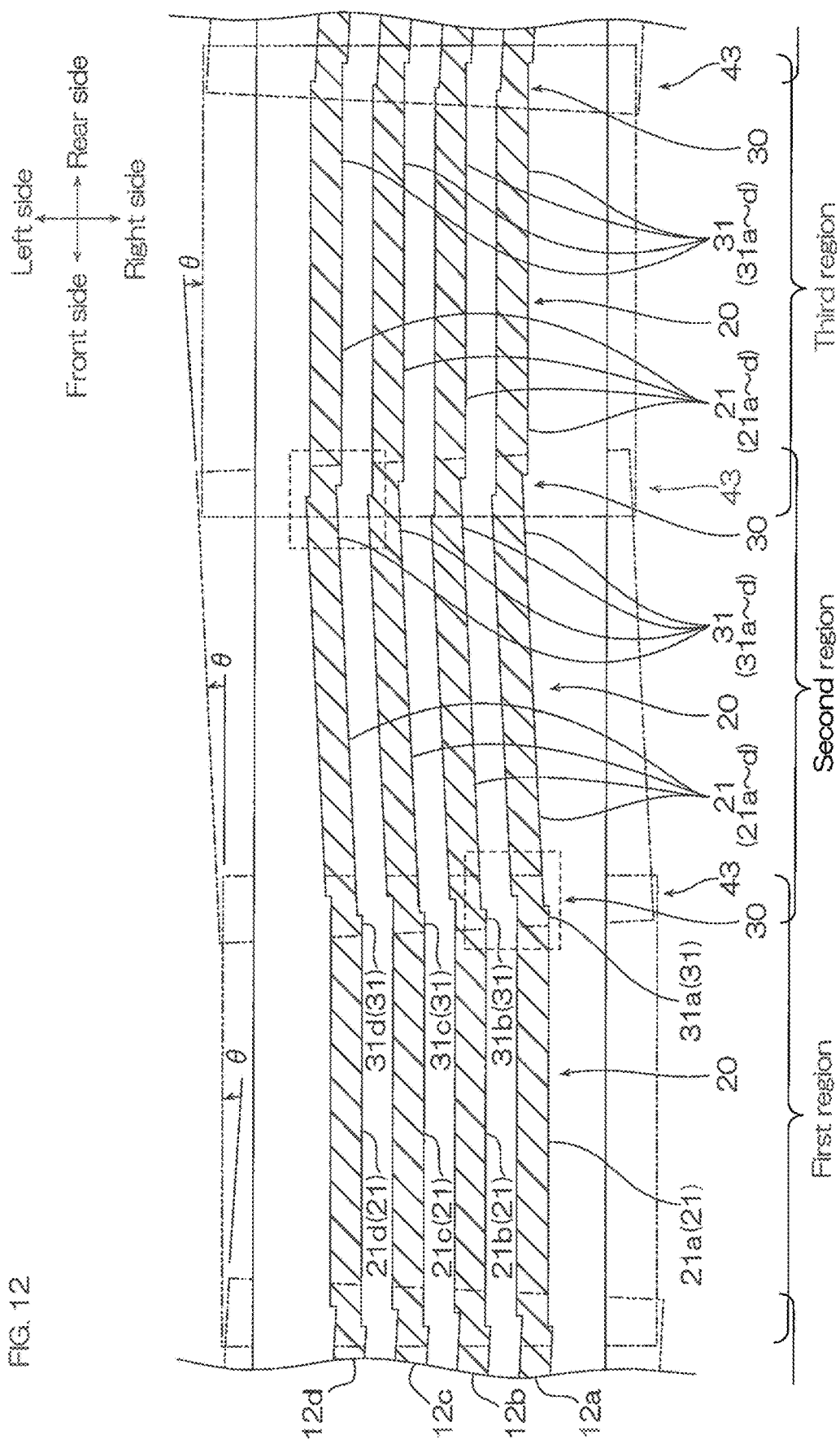
FIG. 12 shows a partial enlargement view of the wire portion shown in FIG. 11, and a photomask placement.

As shown in FIG. 12, the parallelly arranged linear portion 20 each includes a plurality of (4) linear portions 21 (21a, 21b, 21c, 21d) disposed in left-right direction with equal interval therebetween. The plurality of linear portions 21 are formed into a linear pattern each having a predetermined width and extending linearly. The plurality of linear portions 21 (21a, 21b, 21c, 21d) have substantially the same shape.

The parallelly arranged connection portion 30 each includes a plurality of (4) connection portions 31 (31a, 31b, 314, 31d) disposed in left-right direction with equal interval therebetween. The plurality of connection portions 31 have substantially the same shape, and its width is formed to be narrower than that of the linear portion 21 (21a, 21b, 21c, 21d).

Next, description is given with reference to FIG. 13 as to one linear portion (hereinafter referred to as first linear portion 22), one connection portion 31 continuous to the rear side of the first linear portion 22, and another linear portion continuous to the rear side of the one connection portion 31 (hereinafter referred to as second linear portion 23), using the wire 12 (12a) at the rightmost in the first region (m-th region) and the second region (m-th+1 region) as an example.

The first linear portion 22 is formed into a linear pattern extending linearly in the first linear direction. The width W of the first linear portion 22 (first width) is substantially the same from the front end to the rear end of the first linear portion 22. The first linear portion 22 includes a fourth side 35 described later.

The first linear portion 22 has a width W of, for example, 10 µm or more, preferably 15 µm or more, and for example, 300 µm or less, preferably 150 µm or less.

The second linear portion 23 is formed into a linear pattern extending linearly in the second linear direction. The width of the second linear portion 23 (second width) is the sane as the width W of the first linear portion 22. The width of the second linear portion 23 is substantially the same from the front end to the rear end of the second linear portion 23. The second linear portion 23 has substantially the same shape as that of the first linear portion 22, except for the direction of the extension of the second linear portion 23. The second linear portion 23 includes a third side 34 described later.

The first linear direction and the second linear direction form an angle θ ($0<θ<1$ deg, preferably $0.01$ deg$≤θ≤0.95$ deg, more preferably $0.05$ deg$≤θ≤0.95$ deg). To be specific, the first widthwise one end edge 24a of the first linear portion 22 and the second widthwise one end edge 25a of the second linear portion 23 form an angle θ ($0<θ<1$ deg, preferably $0.01$ deg$≤θ≤0.95$ dog, more preferably $0.05$ deg$≤θ≤0.95$ deg).

The connection portion 31 is disposed between the first linear portion 22 and the second linear portion 23 so as to connect them. The front end edge of the connection portion 31 is continuous with the rear end edge of the first linear portion 22, and the rear end edge of the connection portion 31 is continuous with the front end edge of the second linear portion 23.

The connection portion 31 includes a first side 32 and second side 33.

The first side 32 is formed so that it extends from the first widthwise one end edge 24a of the first linear portion 22 to further extend along the first linear direction. That is, the first side 32 extends from the one end edge in the first linear direction (rear end edge) of the first widthwise one end edge 24a toward the first linear direction one side (rear side). The length $D_1$ of the first side 32 is the same as that in the first embodiment.

The second side 33 is formed so as to extend from the second widthwise other end edge 25b of the second linear portion 23 further along the second linear direction. That is, the second side 33 extends from the other end edge in the second linear direction of the second widthwise other end edge 25b (front end edge) toward the second linear direction the other side (front side). The length $D_2$ of the second side 33 is the same as that in the first embodiment.

The third side 34 is formed so as connect the end edge of the first side 32 and the end edge of the second widthwise one end edge 25a of the second linear portion 23, and further extend along the first width direction (an example of first-crossing direction crossing the first linear direction and the second linear direction). That is, the third side 34 is a line that connects one end edge in the first linear direction (rear end edge) of the first side 32 with the other end edge in the second linear direction (front end edge) of the second widthwise one end edge 25a. The length D₃ of the third side 34 is the same as that in the first embodiment.

The fourth side 35 is formed so as to connect the end edge of the second side 33 with the end edge of the first widthwise other end edge 24b of the first linear portion 22, and extend along the second width direction (an example of second-crossing direction crossing the first linear direction and the second linear direction). That is, the fourth side 35 is a line that connects the other end edge in the second linear direction (front end edge) of the second side 33 with one end edge of the first widthwise other end edge 24b in the first linear direction (rear end edge). The length D₄ of the fourth side 35 is the same as that in the first embodiment.

The second widthwise one end edge 25a of the second linear portion forms a second corner portion 38 with the third side 34 and its angle is 90°+θ. The second side 33 forms a third corner portion 39 with the fourth side 35, and its angle is substantially the right angle. The fifth corner portion 45 formed with the first side 32 and the third side 34 is substantially right angle.

The connection portion 31 has a width narrower than that of the first linear portion 22 and the second linear portion 23. That is, at the connection portion 31, the first width of the first side 32 and the second side 33 is narrower than the width W of the first linear portion 22.

The second linear portion 23 satisfies the relationship of formula (4) below.

$$0 < y_2 < W \quad (4)$$

Y₂ represents a length from the second corner portion 38 to the first side 32 along the first width direction. That is, it represents the shortest distance of the first width between the second corner portion 38 and the first side 32. Y₂ is a dislocation in the first width direction of the second linear portion 23 relative to the first linear portion 22.

Y₂ is, for example, 0.1 μm or more, preferably 0.5 μm or more, more preferably 1 μm or more, and for example, 15 μm or less, preferably 10 μm or less.

W represents the first width of the first linear portion 22, and is the same as that in the first embodiment.

The ratio of W to y₂ (W/y₂) is, for example, 2 or more, preferably 5 or more, and for example, 100 or less, preferably 50 or less.

The first linear portion 22 satisfies the relationship of formula (5) below.

$$D_1 \times \tan\theta + y_2' < W \quad (5)$$

Y₂' represents a length from the third corner portion 39 to the first widthwise other end edge 24b of the first linear portion 22 along the first width direction. That is, it represents the shortest distance of the first width between the third corner portion 39 and the first widthwise other end edge 24b. Y₂' is also a dislocation in the first width direction of the second linear portion 23 relative to the first linear portion 22.

Y₂' is, for example, 0.1 μm or more, preferably 0.5 μm or more, more preferably 1 μm or more, and for example, 15 μm or less, preferably 10 μm or less.

Although the wire 12a at the rightmost of the first region and the second region is described above, the same thing applies to the wires (12b to 12d) other than the wire 12a.

Figure 14:
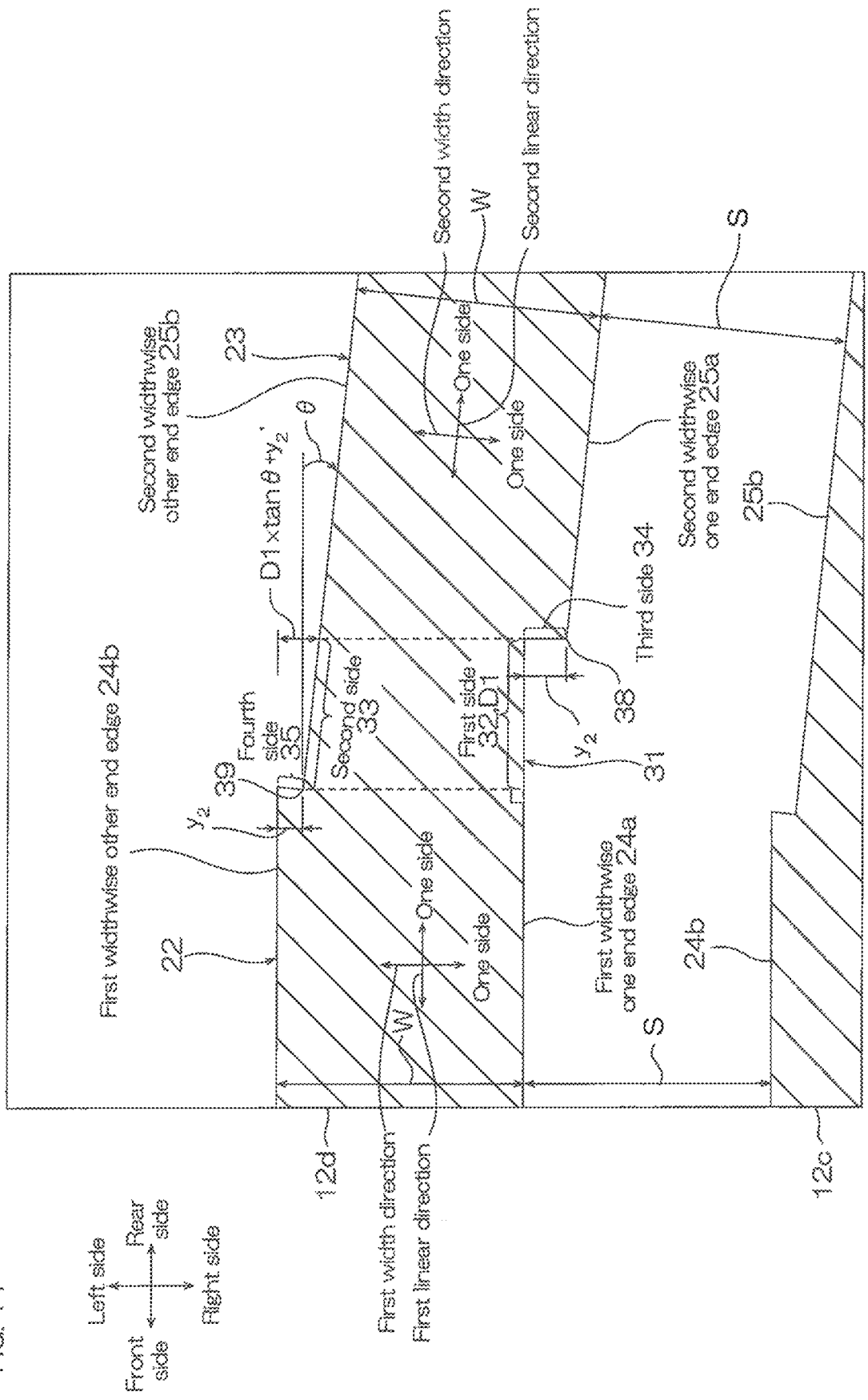
FIG. 14 shows a partial enlargement of the connection portion in the second region and the third region shown in FIG. 12.

The same can be said to the wire 12 in the second region and the third region as well. FIG. 14 shows a partial enlargement of the leftmost wire 12 as an example. In this case, the linear portion of the wire 12 in the second region (in FIG. 14, font side) is regarded as the first linear portion 22, and the linear portion of the wire 12 in the third region (in FIG. 14, rear side) is regarded as the second linear portion 23.

Figure 13:
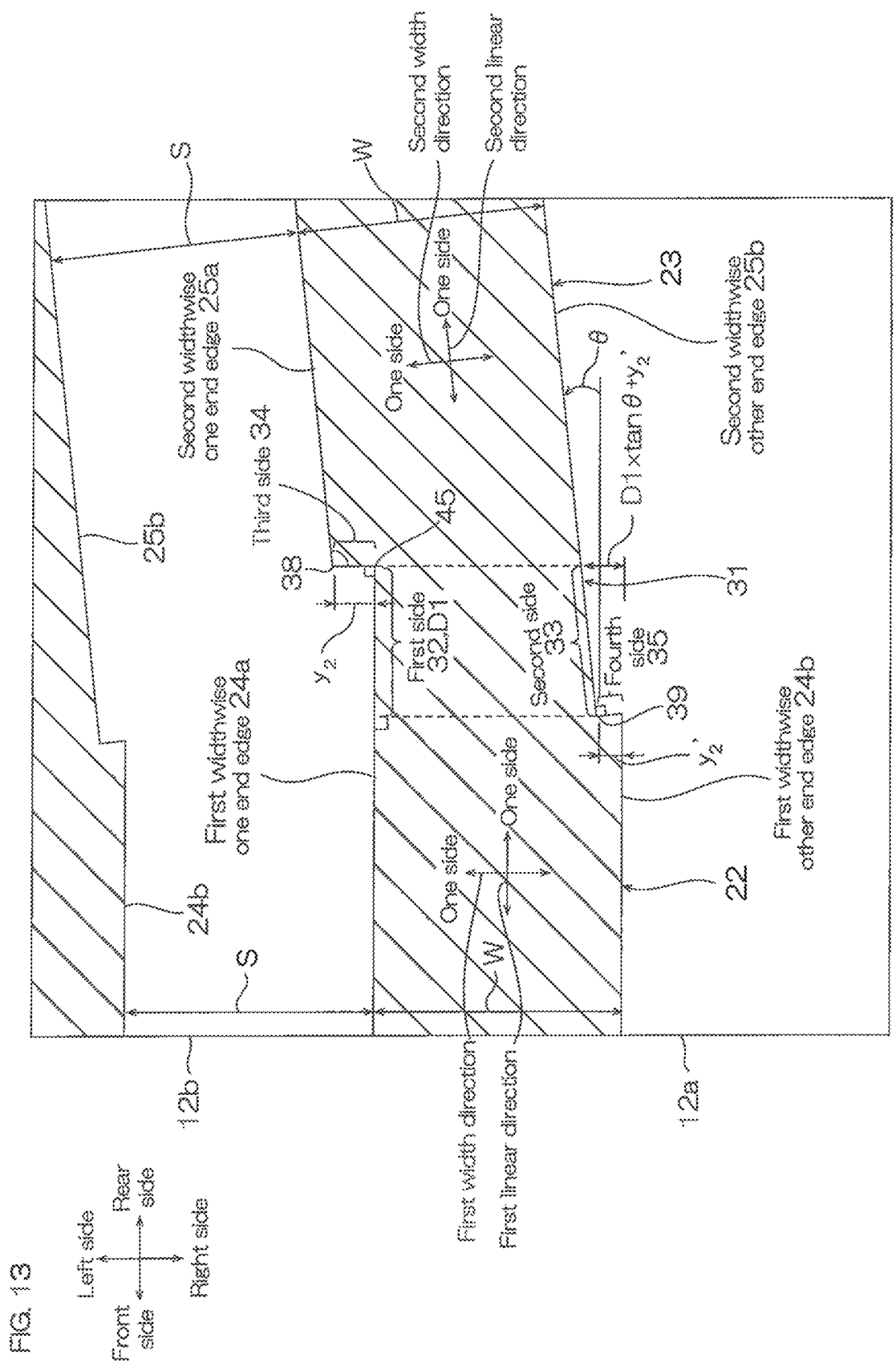
FIG. 13 shows a partial enlargement view of the connection portion in the first region and the second region shown in FIG. 12.

As shown in FIG. 13 (relationship between the first region and the second region), with regard to the angle θ formed with the first linear direction of one linear portion and the second linear direction of another linear portion (0<θ<1 deg), when the second linear direction tilts toward the left side relative to the first linear direction, that is, the circumferential direction from the first linear direction toward the second linear direction is counterclockwise, the first widthwise one end edge 24a and the second widthwise one and edge 25a are positioned at the left side, and the first widthwise other end edge 24b and the second widthwise other end edge 25b are positioned at the right side.

Meanwhile, as shown in FIG. 14 (relationship between the second region and the third region), with regard to the angle θ formed with the first linear direction of one linear portion and the second linear direction of another linear portion (0<θ<1 deg), when the second linear direction tilts toward the right side relative to the first linear direction, that is, when the circumferential direction from the first linear direction toward the second linear direction is clockwise, the first widthwise one end edge 24a and the second widthwise one end edge 25a are positioned at the right side, and the first widthwise other end edge 24b and the second widthwise other end edge 25b are positioned at the left side.

The wire length of the wire portion 9 is the same as that in the first embodiment.

Production Method in Second Embodiment

A method for producing a wired circuit board 1 is described with reference to FIG. 15 and FIG. 12. The wired circuit board 1 is produced by semiadditive method, and for example, includes a first step, in which an insulating base layer 2 is prepared, a second step, in which a conductive pattern 3 is formed on the surface of the insulating base layer 2, and a third step, in which an insulating cover layer 4 is formed on the surface of the conductive pattern 3.

(First Step)

Figure 15A:
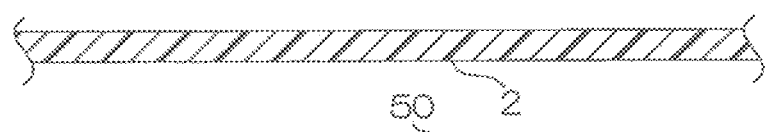
FIG. 15A-FIG. 15I show process diagrams of the method for producing a wired circuit board shown in FIG. 11, FIG. 15A illustrating a step of preparing an insulating base layer, FIG. 15B illustrating a step of forming a metal thin film, FIG. 15C illustrating a step of forming a photo resist, FIG. 15D illustrating a step of exposing the photo resist to light, FIG. 15E illustrating a step of developing the photo resist, FIG. 15F illustrating a step of forming wires, FIG. 15G illustrating a step of removing the photo resist, FIG. 15H illustrating a step of removing a metal thin film, and FIG. 15I illustrating a step of forming an insulating cover layer.

In the first step, as shown in FIG. 15A, an insulating base layer 2 elongated in front-rear direction is prepared. To be specific, it is prepared in the same manner as in the first embodiment.

(Second Step)

In the second step, a conductive pattern 3 is formed on the surface of the insulating base layer 2. That is, the electronic component terminal portion 7, wire portion 9, and external component terminal portion 8 are formed on the upper face of the insulating base layer 2.

To be specific, the second step includes a step (1), in which the metal thin film 50 is formed on the surface of the insulating base layer 2, a step (2), in which the photo resist 51 is formed on the surface of the metal thin film 50, a step (3), in which the photo resist 51 is exposed to light with a photomask interposed therebetween, a step (4), in which the metal thin film 50 is exposed by development, a step (5), in which a conductive pattern 3 is formed by plating on the surface of the metal thin film 50, and a step (6), in which the metal thin film 50 facing the remaining photo resist 51, and the remaining photo resist 51 are removed.

Step (1)

Figure 15B:

As shown in FIG. 15B, the metal thin film 50 is formed on the surface of the insulating base layer 2. To be specific, it is prepared in the same manner as in the first embodiment.

Step (2)

Figure 15C:
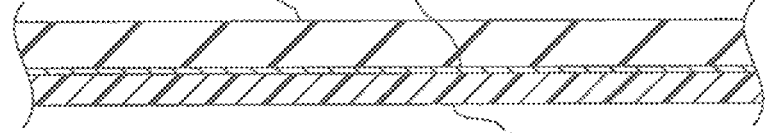

As shown in FIG. 15C, a photo resist 51 is formed on the surface of the metal thin film 50.

The photo resist 51 is a negative type photo resist (negative photo resist). With the negative type photo resist, a portion where shielded (portion where a predetermined amount or more of light was not applied, that is, portion where application of less than a predetermined amount of light was allowed) at the time of light exposure is removed in the development thereafter, and meanwhile, a portion where a predetermined amount or more of light was applied at the time of light exposure remains in the development thereafter. The photo resist 51 include, for example, dry film resist.

To be specific, it is the same as that in the first embodiment except that a negative type photo resist is used.

Step (3)

Figure 15D:
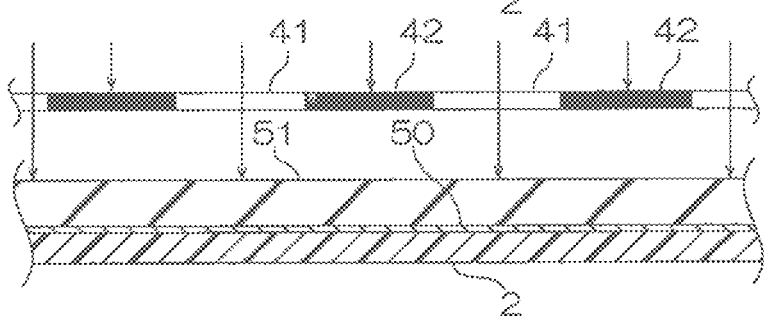

As shown in FIG. 15D, the photo resist 51 is exposed to light with a photomask interposed therebetween.

For the photomask, a wire-photomask 40 and a terminal-photomask (not shown) a prepared.

As shown in FIG. 16, the wire-photomask 40 is formed into a generally rectangular when viewed from the top.

The wire-photomask 40 has, for example, a shield portion 42 and a light transmission portion 41.

The shield portion 42 is formed into a pattern of a plurality of (4) straight lines arranged in parallel.

The shield portion 42 is formed into a pattern of a plurality of (4) straight lines arranged in parallel corresponding to a plurality of (4) wires 12. To be specific, the shield portion 42 includes a plurality of (4) shield regions having a generally rectangular shape when viewed from the top extending linearly in front-rear direction, and the plurality of shield regions have the same shape and arranged in parallel with a space provided therebetween in left-right direction. The shield portion 42 is formed from a light shielding material such as metal plate.

The light transmission portion 41 defines a portion other than the shield portion 42 in the wire-photomask 40, and for example, is formed from a light transmitting material such as glass plate.

Then, the photomask is disposed to face the surface of the photo resist 51, and the photo resist 51 is exposed to light with a photomask interposed therebetween. To be specific, it is prepared in the same manner as in the first embodiment.

As shown in FIG. 12, when the pattern of the wire portion 9 is exposed to light through the wire-photomask 40, light exposure is conducted a plurality of times (n times) while shifting the wire-photomask 40 in front-rear direction (for example, first linear direction) one after another so that the connection portion 31 is formed in each of the wires 12. To be specific, it is prepared in the same manner as in the first embodiment.

In this manner, by conducting the following steps (development process, wire-forming process), in the region (overlapping region 43) where the previous photomask overlaps with the following photomask, a connection portion 31 with a narrower width than that of the linear pattern is formed at the first width. Also, the linear portion 21 corresponding to the linear pattern is formed with the adjacent two overlapping regions 43.

It is disposed so that the second linear direction relative to the first linear direction, and the front end of the previous wire-photomask 40 relative to the rear end of the following wire-photomask 40 shift in left-right direction to a small degree (that is, in the range of length $y_2$ or length $y_2$'). In particular, when the second linear direction tilts toward the left side relative to the first linear direction, and when the circumferential direction from the first linear direction to the second linear direction is counterclockwise in FIG. 12, preferably, the front end of the previous wire-photomask 40 is disposed to shift a little to the left side (the other side in the first width direction) relative to the rear end of the following wire-photomask 40 (that is, to achieve length $y_2$ or length $y_2$')(ref: FIG. 13). Meanwhile, when it tilts to the right side, the circumferential direction from the first linear direction to the second linear direction is clockwise in FIG. 12, preferably, the front end of the previous wire-photomask 40 is disposed to shift a little to the right side (one side in the first width direction) relative to the rear end of the following wire-photomask 40 (that is, to achieve length $y_2$ or length $y_2$')(ref: FIG. 14). Preferably, the light exposure time (n/2 times) is substantially the same to achieve the positioning shown in FIG. 13 and FIG. 14.

The light exposure time n of the wire portion 9 is the same as that in the first embodiment.

Step (4)

Figure 15E:
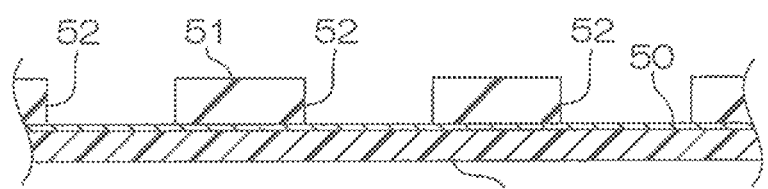

As shown in FIG. 15E, the metal thin film 50 is exposed by development.

That is, the photo resist 51 facing the shield portion 42 is removed.

To be specific, first, as necessary, the photo resist 51 after exposure to light is heated (heating after light exposure).

Then, the photo resist 51 is developed with a developer. This causes, in the photo resist 51, the portion other than the shield portion 42 (exposed portion) to remain, and only the shield portion 42 (unexposed portion) to be removed. That is, in the photo resist 51, the opening 52 corresponding to the shield portion 42 is formed. The opening 52 penetrates the photo resist 51 in the thickness direction.

This causes the metal thin film corresponding to the shield portion 42, that is, the metal thin film 50 facing the opening 52 is exposed.

Step (5)

Figure 15F:
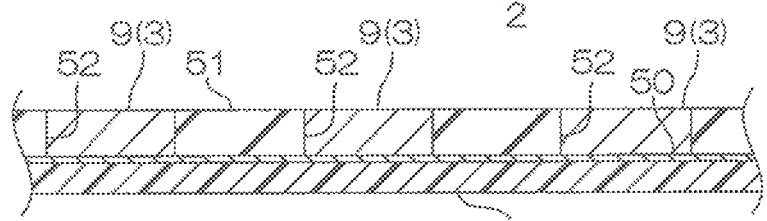

As shown in FIG. 15F, the conductive pattern 3 is formed on the surface of the exposed metal thin film 50 by plating. To be specific, it is prepared in the same manner as in the first embodiment.

Step (6)

Figure 15G:
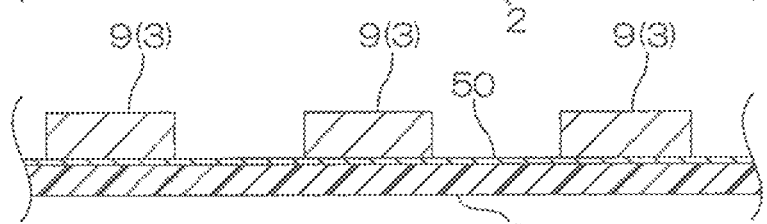
Figure 15H:
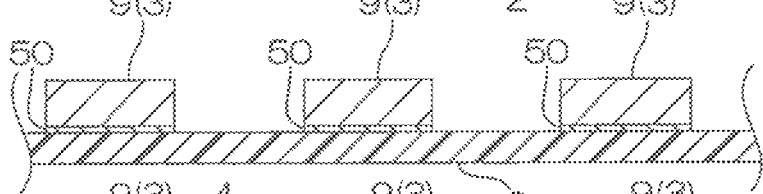

As shown in FIG. 15G and FIG. 15H, the remaining photo resist 51 and the metal thin film 50 facing the remaining photo resist 51 are removed. To be specific, it is prepared in the same manner as in the first embodiment.

(Third step)

Figure 15I:
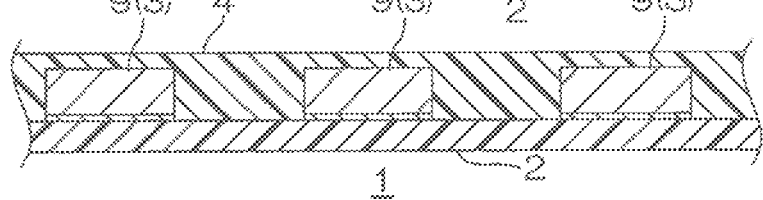

In the third step, as shown in FIG. 15I, the insulating cover layer 4 is formed on the surface of the wire portion 9. To be specific, it is prepared in the same manner as in the first embodiment.

The wired circuit board 1 including the insulating base layer 2, conductive pattern 3, and insulating cover layer 4 is produced in this manner.

The wired circuit board 1 is suitably used, for example, as a wired circuit board for catheters, as shown in FIG. 8A-FIG. 8B.

Operation and Effect of Second Embodiment

In the wired circuit board, a plurality of wires each includes (1) first linear portion 22 extending in the first linear direction, (2) second linear portion 23 having the same width as that of the first linear portion 22, disposed at one side in the first linear direction of the first linear portion 22, and extending in the second linear direction so as to have a predetermined angle 9 relative to the first linear portion 22, and (3) connection portion 31 disposed between the first linear portion 22 and the second linear portion 23, continuous with these linear portions 22 and 23, and having a width broader than that of these linear portions 22 and 23. The connection portion 31 includes (1) first side 32 extending from the first widthwise one end edge 24a of the first linear portion 22 further along the first linear direction, and (2) second side 33 extending from the second widthwise other end edge 25b of the second linear portion 23 further along the second linear direction. The second linear portion 23 includes (3) third side 34 connecting the first side 32 with the second linear direction end edge of the second widthwise one end edge 25a of the second linear portion 23, and extending along the first width direction. The first linear portion 22 includes (4) fourth side 35 connecting the second side 33 with the first linear direction end edge of the first widthwise other end edge 24b of the first linear portion 22, and extending along the second width direction. The relationship of $0 < y_2 < W$ and $0 < \theta < 1$ deg are satisfied. $Y_2$ represents a length from the second corner portion 38 to the first side 32 along the first width direction. W represents the first width W of the first linear portion 22.

Thus, the length $y_2$ from the second corner portion 38 to the first side 32, and the first width W of the first linear portion 22 satisfy the relationship of $0 < y_2 < W$. That is, at the connection portion 31 between the first linear portion 22 and the second linear portion 23, widthwise dislocation between the first linear portion 22 and the second linear portion 23 is shorter than the width W of the first linear portion 22. Also, the predetermined angle θ satisfies θ<1 deg. That is, the angle formed with the first linear portion 22 and the second linear portion 23 is small. Thus, even if the wire 12a is formed into an elongated form, linearity can be secured, and in the wire 12 continuous in the front-rear direction, disconnection at the connection portion 31 can be suppressed, and connection reliability is excellent.

Also, the predetermined angle θ satisfies 0<θ. That is, the angle formed with the linear direction of the first linear portion 22 and the linear direction of the second linear portion 23 is small. Thus, strict adjustment for the angle formed with the first linear portion 22 and the second linear portion 23 is unnecessary, and therefore productivity is excellent.

In the wired circuit board, the relationship of formula $D_1 \times \tan \theta + y_2' < W$ is satisfied. $Y_2'$ represents a length from the third corner portion 39 to the first widthwise other end edge 24b of the first linear portion 22 along the first width direction.

Thus, at the connection portion 31 between the first linear portion 22 and the second linear portion 23, disconnection can be suppressed even more reliably.

When the above-described formula is not satisfied, that is, when $D_1 \times \tan \theta + y_2' \geq W$, the fifth corner portion 45 (ref: FIG. 13) formed with the first side 32 and the third side 34 makes contact with the second widthwise other end edge 25b of the second linear portion 23. That is, the connection between the connection portion 31 and the second linear portion 23 is cut.

The wired circuit board 1 includes the insulating base layer 2, conductive pattern 3 provided on the upper face of the insulating base layer 2, and insulating cover layer 4 provided on the upper face of the conductive pattern 3, and the conductive pattern 3 includes the wire 12.

Thus, the insulating base layer 2, wire 12, and insulating base layer 2 are disposed so as to make contact in this order.

Thus, no adhesive layer is necessary. As a result, moisture and heat resistance is excellent, and the thickness can be decreased.

When the wire length of the wire portion 9 is 600 mm or more in the wired circuit board 1, it can be suitably used as a wired circuit board for catheters.

Modified Example of the Second Embodiment

Modified example of the second embodiment is described next. In the following figures, the members that are the same as the above-described ones are given the same reference numerals, and descriptions thereof are omitted.

(1) In the embodiment shown in FIG. 13, the front side is the first linear portion 22, and the rear side is the second linear portion 23, but for example, as shown in FIG. 17, the rear side can be first linear portion 22, and the front side can be the second linear portion 23. In the embodiment shown in FIG. 14, the front side is the first linear portion 22, and the rear side is the second linear portion 23, but for example, although not shown, the rear side can be the first linear portion 22, and the front side can be the second linear portion 23.

Figure 18:
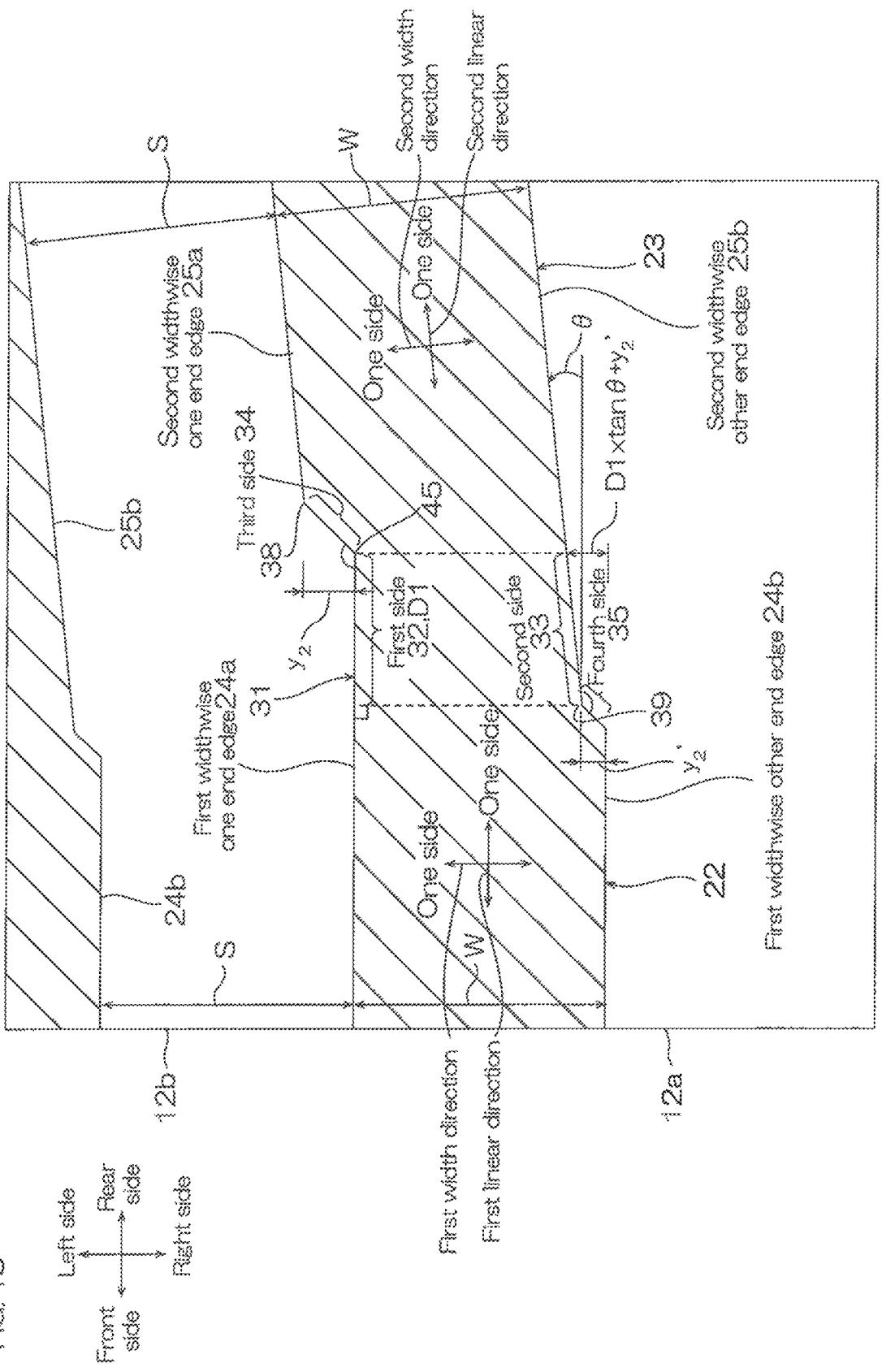
FIG. 18 shows an enlarged plan view of the wired circuit board in a modified example (embodiment in which the second corner portion and the third corner portion form an obtuse angle) of the first embodiment.

(2) In the embodiment shown in FIG. 13, the angle of the third corner portion 39 and the fifth corner portion 45 is substantially right angle, but for example, as shown in FIG. 18, the angle of the third corner portion 39 and the fifth corner portion 45 can be an obtuse angle.

In the embodiment shown in FIG. 18, the angle of the third corner portion 39 and the fifth corner portion 45 is more than 90°, preferably 100° or more, and for example, 160° or less, preferably 140° or less.

The third side 34 is formed so as to connect the end edge of the first side 32 with the end edge of the second widthwise one end edge 25a of the second linear portion 23, and to extend along the first-crossing direction crossing the first linear direction and the second linear direction.

The fourth side 35 is formed so as to connect the end edge of the second side 33 with the end edge of the first widthwise other end edge 24b of the first linear portion 22, and to extend along the second-crossing direction crossing the first linear direction and the second linear direction.

In this embodiment as well, preferably, as an approximate value, the relationship of formula (5) is satisfied.

In the embodiment shown in FIG. 18, it is produced by adjusting light exposure angle and amount at the front-rear direction end portion of the light transmission portion 41 in the light exposure process shown in FIG. 15D.

(3) In the embodiment shown in FIG. 12, the plurality of linear portions 21 (21a, 21b, 21c, 21d) each has the same first width W, but for example, although not shown, the plurality of linear portions 21 (21a, 21b, 21c, 21d) each can have a different first width W.

In this embodiment, in step (3), light exposure is conducted by using a wire-photomask 40 (not shown) having a different left-right direction length in the pattern of plurality of straight lines in the shield portion 42.

(4) In the embodiment shown in FIG. 12, a plurality of wire intervals S are all the same length, but for example, although not shown, the plurality of wire intervals S can be different.

In this embodiment, in step (3), light exposure is conducted by using a wire-photomask 40 (not shown) having a different left-right direction interval in the pattern of plurality of straight lines in the light transmission portion 41.

(5) In the embodiment shown in FIG. 11, a support substrate is not included, but for example, although not shown, a support substrate such as a metal plate can be included at a portion of the lower face (the other side in thickness direction) of the insulating base layer 2. To be specific, it is prepared in the same manner as in the modified example of the first embodiment.

(6) In the light exposure process and development process of the embodiment shown in FIG. 15D and FIG. 15E, in all the formation of the conductive pattern 3, the photomask is used for light exposure, and the photo resist 51 is developed, but for example, although not shown, by using a laser direct imaging in the formation of a portion of the conductive pattern 3, the photo resist 51 can be developed. To be specific, it is prepared in the same manner as in the modified example of the first embodiment.

(7) In FIG. 12, in all of the plurality of the parallelly arranged linear portions 20, the linear portion 21 of two adjacent parallelly arranged linear portion 20 forms an angle θ (0<θ<1 deg), but for example, although not shown, in a portion of the parallelly arranged linear portion 20, the angle formed by the linear portion 21 of the two adjacent parallelly arranged linear portion 20 can be 0 deg, or it can be more than 1 dog.

Preferably, the region whom the linear portions 21 of the two adjacent parallelly arranged linear portions 21 form the angle θ (0<θ<1 deg) is preferably 50% or more, more preferably 80% or more, even more preferably 100% relative to the entire region of the two adjacent parallel arranged linear portions 21.

In the embodiments of these (1) to (7) as well, the same operation and effect of the embodiments in the above-described FIG. 11 to FIG. 15 can be achieved.

While the illustrative embodiments of the present invention are provided in the above description, such is for illustrative purpose only and it is not to be construed as limiting in any manner.

Modification and variation of the present invention that will be obvious to those skilled in the art is to be covered by the following claims.

INDUSTRIAL APPLICABILITY

The wired circuit board of the present invention can be suitably used for various industrial products, and for example, can be suitably used for a wired circuit board for catheters.

DESCRIPTION OF REFERENCE NUMERALS

1 wired circuit board
2 insulating base layer
3 conductive pattern
4 insulating cover layer
9 wire portion
12 wire
21 linear portion
31 connection portion
22 first linear portion
23 second linear portion
24a first widthwise one end edge
24b first widthwise other end edge
25a second widthwise one end edge
25b second widthwise other end edge
32 first side
33 second side
34 third side
35 fourth side
36 first corner portion
38 second corner portion
39 third corner portion
40 wire-photomask
41 light transmission portion
42 shield portion
43 overlapping region
50 metal thin film
51 photo resist

The invention claimed is:

1. An elongated wired circuit board including a plurality of wires arranged in parallel,
wherein the plurality of wires each includes
a first linear portion extending in a first linear direction,
a second linear portion having the same width as that of the first linear portion, disposed at one side in the first linear direction of the first linear portion, and extending in a second linear direction so as to have a predetermined angle θ relative to the first linear portion, and
a connection portion disposed between the first linear portion and the second linear portion, being continuous with the first linear portion and the second linear portion, and having a width narrower than that of the first linear portion,
the connection portion includes
a first side further extending from a first widthwise one end edge orthogonal to the first linear direction of the first linear portion along the first linear direction,
a second side further extending from the second widthwise other and edge orthogonal to the second linear direction of the second linear portion along the second linear direction, and
the second linear portion includes
a third side connecting the first side with the second widthwise one end edge of the second linear portion, and extending along the first-crossing direction crossing the first linear direction and the second linear direction, and
the first linear portion includes
a fourth side connecting the second side with the first widthwise other end edge of the first linear portion, and extending along the second-crossing direction crossing the first linear direction and the second linear direction,
length $y_2$ and length W satisfy the relationship of $0<y_2<W$,
the length $y_2$ extending from a second corner portion formed with the first widthwise one end edge of the second linear portion and the third side and reaching the first side along the first width direction, and
the length W being the first width of the first linear portion, and
the predetermined angle θ satisfy the relationship of 0<θ<1 deg.

2. The wired circuit board according to claim 1, wherein the first side length $D_1$ and the first width W satisfy the relationship of $D_1 \times \tan θ + y_2' < W$ (where $y_2'$ represents a length from a third corner portion formed with the second side and the fourth side to the first widthwise other end edge of the first linear portion along the first width direction).

3. The wired circuit board according to claim 1, wherein the wire has a wire length of 600 mm or more.

4. The wired circuit board according to claim 1 comprising
a first insulating layer,
a conductive pattern provided at one surface in the thickness direction of the first insulating layer, and
a second insulating layer provided at one surface in the thickness direction of the conductive pattern,
wherein the conductive pattern includes the wire.

\* \* \* \* \*